(12) United States Patent
Boroson et al.

(10) Patent No.: US 7,564,182 B2
(45) Date of Patent: Jul. 21, 2009

(54) BROADBAND LIGHT TANDEM OLED DISPLAY

(75) Inventors: Michael L. Boroson, Rochester, NY (US); Jeffrey P. Spindler, Rochester, NY (US); Tukaram K. Hatwar, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 175 days.

(21) Appl. No.: 11/170,696

(22) Filed: Jun. 29, 2005

(65) Prior Publication Data

US 2007/0001588 A1 Jan. 4, 2007

(51) Int. Cl.
*H01J 1/62* (2006.01)
*H05B 33/00* (2006.01)

(52) U.S. Cl. ..................... 313/504; 313/112

(58) Field of Classification Search ......... 313/501–512, 313/112; 428/690
See application file for complete search history.

(56) References Cited

U.S. PATENT DOCUMENTS

| | | | |
|---|---|---|---|
| 4,769,292 A | | 9/1988 | Tang et al. |
| 4,885,211 A | | 12/1989 | Tang et al. |
| 5,405,709 A | | 4/1995 | Littman et al. |
| 5,683,823 A | | 11/1997 | Shi et al. |
| 5,703,436 A | | 12/1997 | Forrest et al. |
| 5,965,907 A | * | 10/1999 | Huang et al. .................. 257/89 |
| 6,107,734 A | | 8/2000 | Tanaka et al. |
| 6,259,838 B1 | * | 7/2001 | Singh et al. .................... 385/31 |
| 6,337,492 B1 | | 1/2002 | Jones et al. |
| 6,392,340 B2 | | 5/2002 | Yoneda et al. |
| 6,717,358 B1 | | 4/2004 | Liao et al. |
| 6,903,378 B2 | | 6/2005 | Cok |
| 7,142,179 B2 | * | 11/2006 | Miller et al. .................. 345/76 |
| 2003/0170491 A1 | | 9/2003 | Liao et al. |
| 2003/0189401 A1 | | 10/2003 | Kido et al. |
| 2005/0040756 A1 | | 2/2005 | Winters et al. |
| 2006/0087225 A1 | * | 4/2006 | Liao et al. .................... 313/504 |

FOREIGN PATENT DOCUMENTS

| | | |
|---|---|---|
| EP | 1 339 112 | 8/2003 |
| WO | 2005/115059 | 12/2005 |
| WO | 2006/047170 | 5/2006 |

OTHER PUBLICATIONS

English Abstract of JP 07-142169.
English Abstract of JP 2003-045676.
Kido et al. in Applied Physics Letters, 64, 815 (1994).
Deshpande et al. in Applied Physics Letters, 75, 888 (1999).
Tokito, et al. in *Applied Physics Letters*, 83, 2459 (2003).
Matsumoto and Kido et al., reported in SID 03 Digest, 979 (2003).

* cited by examiner

*Primary Examiner*—Joseph L Williams
(74) *Attorney, Agent, or Firm*—Raymond L. Owens

(57) ABSTRACT

A tandem OLED display for producing broadband light having at least two spaced electrodes includes two or more broadband light-emitting units disposed between the electrodes, at least two of which produce light having different emission spectra and wherein at least one of such broadband light-emitting units does not produce white light, and an intermediate connector disposed between adjacent light-emitting units.

15 Claims, 10 Drawing Sheets

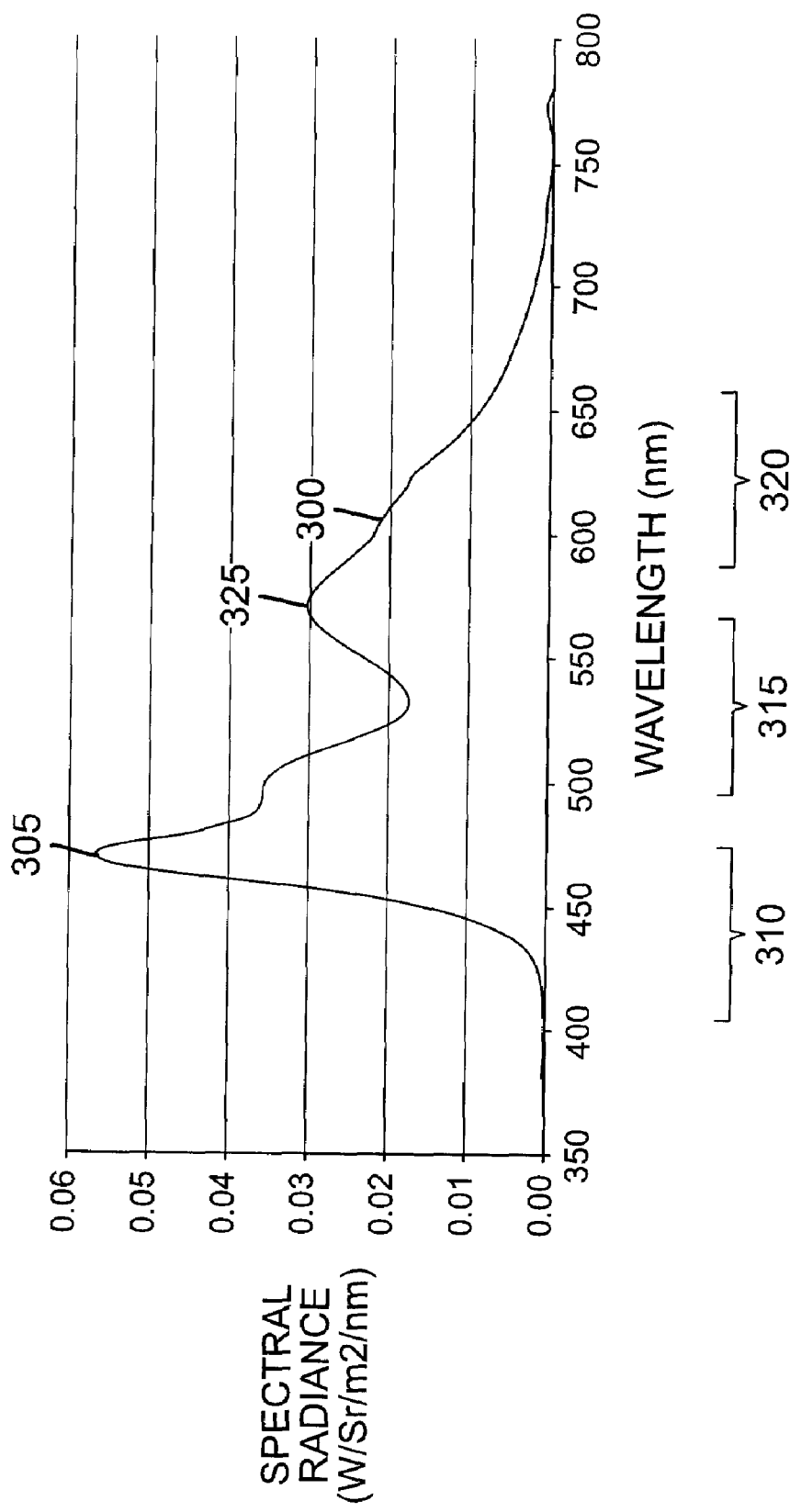

BROADBAND LIGHT TANDEM OLED DISPLAY

CROSS REFERENCE TO RELATED APPLICATIONS

Reference is made to commonly assigned U.S. patent application Ser. No. 10/970,928 filed Oct. 22, 2004 by Liang-Sheng Liao et al. entitled "White OLEDS With a Color-Compensated Electroluminescent Unit", the disclosure of which is incorporated herein by reference.

FIELD OF THE INVENTION

The present invention relates to broadband light-producing OLED displays.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing angle and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light is used in conjunction with filters or color change modules to produce displays with at least two different colors or a full color display. In particular, there is a need for broadband light OLEDs (or broadband OLEDs) where there is substantial emission in the red, green, and blue portions of the spectrum, wherein a broadband-emitting EL layer is used to form a multicolor device in conjunction with filters or color change modules.

A white OLED device is one type of broadband OLED device such that the emission generally has 1931 Commission Internationale d'Eclairage (CIE) chromaticity coordinates, (CIEx, CIEy), of about (0.31, 0.33). White OLEDs have been reported in the prior art, such as reported by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited because each type of molecule only emits light with a relatively narrow spectrum under normal conditions. A LEL comprising a host material and one or more than one luminescent dopant(s) can achieve light emission from both the host and the dopant(s) resulting in a broadband emission in the visible spectrum if the energy transfer from the host material to the dopant(s) is incomplete. However, a broadband OLED with only one LEL will have neither a wide enough emission covering the whole visible spectrum, nor will it have a high luminance efficiency. A broadband OLED having two LELs can have better color as well as better luminance efficiency than a device with one LEL. However, it is difficult to achieve a broad emission with a balanced intensity from more than two colors because a broadband OLED having two LELs typically has only two intensive emission peaks. For example, in a commonly used broadband OLED having two LELs, if the colors of the LELs are yellow and greenish blue, the red, green, or blue color emissions will be weak in the device; if the colors of the two LELs are red and greenish blue, the green, yellow, or blue color emissions will be weak in the device; and if the colors of the LELs are green and red, the blue, blue-green, or yellow colors will be weak. A broadband OLED having three LELs of different colors was also proposed but it is still difficult to achieve a broad emission from the device because the most intensive light typically comes from the LEL with a dopant having the narrowest optical band gap and the emission spectrum shifts with different drive conditions.

In a full color display using broadband OLEDs as the pixels, the perceived red, green, or blue color from the human eyes comes from the pixels with a red, green, or blue color filter on top of the pixels, respectively. If each of the broadband OLED pixels in the display has an emission including balanced red, green, and blue primary color components, the light intensity passing through the color filter is about one third of the broadband emission intensity. However, if the broadband OLED pixels do not have balanced red, green, and blue emission, one of the primary color components will have the intensity lower than one third of the broadband emission intensity after passing through the color filter. As a result, in order to achieve a comparable emission intensity of the specific primary color, the corresponding broadband OLED pixel has to be driven with higher current density causing higher power consumption and a shorter lifetime. Therefore, color compensation is needed for a conventional broadband OLED to achieve balanced red, green, and blue emission.

Similar issues arise in a full color display using broadband OLEDs as the pixels with red and green color change modules with or without red, green, or blue color filters. If the broadband OLED pixels in the display have an emission that results in balanced red, green, and blue primary color components after the color change modules or color filters, then the light intensity for each colored pixel is about one third of the total light intensity. However, if the broadband OLED pixels do not have balanced red, green, and blue emission after the color change modules or color filters, then in order to achieve a comparable emission intensity of the specific primary color, the corresponding broadband OLED pixel has to be driven with higher current density, causing higher power consumption and a shorter lifetime. Therefore, color compensation is also needed for a conventional broadband OLED used with color change modules with or without color filters to achieve balanced red, green, and blue emission.

In order to improve the full color emission of an OLED, stacked OLEDs have been fabricated as disclosed by Forrest et al. in U.S. Pat. No. 5,703,436. These stacked OLEDs are fabricated by vertically stacking multiple, individually addressable OLED units, each emitting light of a different color, and wherein intra-electrodes are provided between each of the vertically stacked OLED units as a way of independently controlling the emission from each individual OLED unit in the OLED device. As a result, full color emission as well as a balanced white color emission is readily achieved. Although this permits for improved color emission and a larger emission area compared to conventional full color OLEDs, the overall construction of the OLED is complex, requiring transparent electrodes, additional bus lines for providing electrical power, as well as a separate power source for each of the stacked OLED units.

Recently, another new type of stacked OLED (or tandem OLED, or cascaded OLED) structure used for EL improvement has been fabricated by Jones et al. in U.S. Pat. No. 6,337,492, Tanaka et al. in U.S. Pat. No. 6,107,734, Kido et al. in JP Patent Publication 2003/045676A and in U.S. Patent Publication 2003/0189401 A1, Liao et al. in U.S. Pat. No. 6,717,358 and U.S. Patent Application Publication 2003/0170491 A1, the disclosures of which are herein incorporated by reference. This stacked OLED is fabricated by stacking several individual OLEDs vertically and driven by only a single power source. Matsumoto and Kido et al., reported in *SID* 03 *Digest,* 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. described a tandem white OLED structure by connecting a red EL unit, a green EL unit, and a blue EL unit in series within the device. When the tandem white OLED is driven by a single power source, white light emission is formed by spectral combination from the red, green, and blue EL units. Although color emission and luminance efficiency are improved, this tandem white OLED cannot be made with less than three EL units, implying that it requires a drive voltage at least 3 times as high as that of a conventional OLED. Another problem of white OLEDs constructed by connecting a red EL unit, a green EL unit, and a blue EL unit in series within a device is that the individual EL units age at different rates, causing a shift in the color of the white OLED over operational time. It is well known that narrow band OLED devices, especially blue and green devices, are typically lower in operational stability than broadband OLED devices. There is a need, therefore, to improve the stability of stacked broadband OLED devices.

A broadband-emitting electroluminescent (EL) layer is used to form a multicolor device. Each pixel is coupled with a color filter element or a color change module element as part of a color filter array (CFA) or a color change module array to achieve a pixilated multicolor display. The organic EL layer is common to all pixels and the final color as perceived by the viewer is dictated by that pixel's corresponding color filter element or color change module element. Therefore a multicolor or RGB device is produced without requiring any patterning of the organic EL layers. An example of a white CFA top-emitting device is shown in U.S. Pat. No. 6,392,340. Other examples of white-light-emitting OLED devices are disclosed in U.S. Pat. No. 5,683,823, JP 07-142169, and U.S. Pat. No. 5,405,709.

One problem in the application of broadband OLED devices, when used with color filters or color change modules, is that the intensity of one or more of the colored components of the emission spectrum is frequently lower than desired. Therefore, passing the broadband light from the OLED through the color filters provides one or more colored light(s) with a lower efficiency than desired. Consequently, the power that is required to produce a white color in the display by mixing red, green, and blue light can also be higher than desired. Therefore, there is a continuing need for improvement in multicolor OLED displays using broadband light-producing OLED devices.

There is also a problem with broadband OLED displays that use one or more EL units that comprise only one LEL within the EL unit. Color compensation of broadband OLED devices that produce at least one color component having an intensity less than desired is achieved by the addition of an EL unit that emits in the wavelength range of the color component having an intensity less than desired. The purpose of this color compensation is to improve efficiency and color purity of the broadband OLED display. It has been observed, however, that narrowband EL units with only one LEL are not as stable as broadband EL units with more than one LEL. Therefore, there is a need to improve broadband OLED devices for color, efficiency, and stability.

Another problem exists with tandem broadband OLED devices due to optical interference effects within the multi-layer OLED structure. It is known in the art that the location of the LEL relative to the reflector layer, typically one of the electrodes, and other interfaces of mismatched optical constants determine the amount of light extracted from the device. The preferred locations for a particular LEL are wavelength dependent. In tandem OLED devices it is difficult to place all of the LELs near their preferred locations. Therefore, there is a need to improve tandem broadband OLED devices to increase the amount of extracted light.

There is also a problem with broadband OLED devices that include emission in non-desired wavelength ranges when used to produce multicolor or full color displays. Power is wasted because a portion of these wavelength ranges are typically absorbed by the color filters used to produce the desired color pixels. In addition, the portions of these non-desired wavelength ranges that are not absorbed result in a decrease in the color purity of the color pixels. One example is a broadband OLED device that includes emission in the cyan, yellow, or magenta wavelength ranges when used to produce full color displays. Power is wasted because portions of these wavelength ranges are typically absorbed by the color filters used to produce the red, green, and blue pixels. In addition the portions of the cyan, yellow, or magenta wavelength ranges that are not absorbed result in a decrease in the color purity of the red, green, and blue pixels. Therefore, there is a need to improve broadband OLED devices to include lower levels of emission in the non-desired wavelength ranges of a multicolor or full color display.

SUMMARY OF THE INVENTION

It is therefore an object of the present invention to produce a more effective broadband light-producing OLED display.

This object is achieved by a tandem OLED display for producing broadband light having at least two spaced electrodes comprising:

a) two or more broadband light-emitting units disposed between the electrodes, at least two of which produce light having different emission spectra and wherein at least one of such broadband light-emitting units does not produce white light; and b) an intermediate connector disposed between adjacent light-emitting units.

Advantages

It has been found that by using a tandem OLED device with two or more broadband light-emitting units where at least one such broadband light-emitting unit is not white, the light produced by the broadband light-emitting units is selected to produce an effective multicolor, full color, or broadband light producing OLED display. It is a further advantage of the present invention that the location of the broadband light-emitting units is selected within the OLED device to increase the amount of light extracted from the OLED device. It is a further advantage of the present invention that the lifetime of an OLED display is improved. It is a further advantage of the present invention that it provides for a device with improved color purity, efficiency, and lifetime.

BRIEF DESCRIPTION OF THE DRAWINGS

FIG. 3a shows an emission spectrum of one embodiment of a white broadband light-emitting unit;

Figure 1:
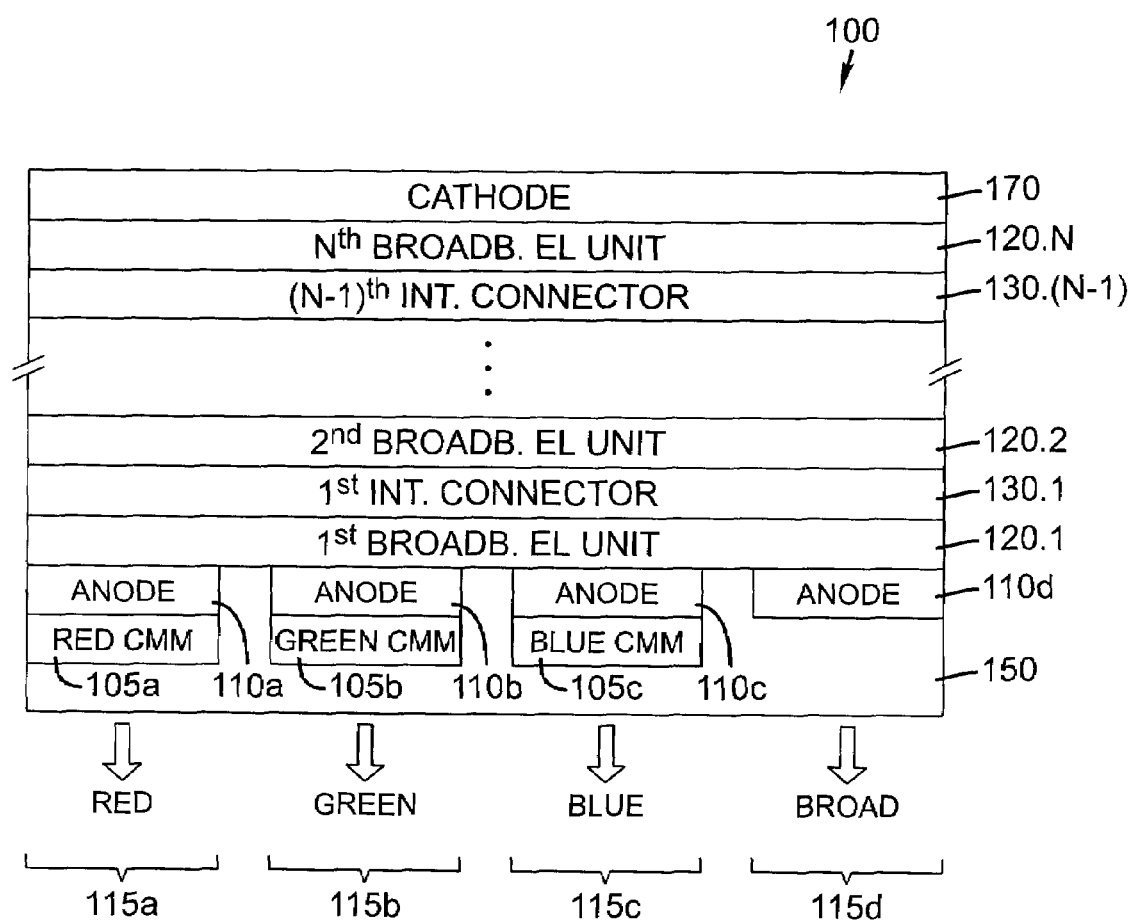
FIG. 1 shows a schematic cross-sectional view of a tandem broadband OLED with N (N≧2) broadband EL units and an array of color modifying media in accordance with the present invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED display", "OLED device" or "organic light-emitting display" is used in its art-recognized meaning of a display device comprising organic light-emitting diodes as pixels. A color OLED display emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is commonly employed to describe multicolor display panels that are capable of emitting in at least the red, green, and blue regions of the visible spectrum and displaying images in any combination of hues. The red, green, and blue colors constitute the three primary colors from which all other colors are produced by appropriate mixing. However, the use of additional colors to extend the color gamut or within the color gamut of the device is possible. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband light or broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color modifying media, e.g. red, green, and blue color filters or color change modules, to produce a practical full color display. Although CIEx, CIEy coordinates of about 0.33, 0.33 are ideal, in some circumstances the actual coordinates can vary significantly and still be very useful.

The present invention is employed in most OLED device configurations. These include very simple structures comprising a single anode and cathode to more complex devices, including passive matrix displays comprised of orthogonal arrays of anodes and cathodes to form pixels, and active-matrix displays where each pixel is controlled independently, for example, with thin film transistors (TFTs). OLED devices of the present invention can operate under forward biasing and so can function under DC mode. It is sometimes advantageous to apply a reverse bias, e.g. in an alternating mode. The OLED device typically does not emit light under reverse bias, but significant stability enhancements have been demonstrated, as described in U.S. Pat. No. 5,552,678.

Turning now to FIG. 1, there is shown a cross-sectional view of one embodiment of a tandem OLED display 100 for producing broadband light in accordance with the present invention. The nature of the broadband light will be described further below. By tandem OLED display, it is meant an OLED display with at least two light-emitting units in a stacked arrangement. This tandem OLED display has at least two spaced electrodes, here an array of anodes (represented by anodes 110a, 110b, 110c, and 110d) and a cathode 170. At least one of the cathode or the array of anodes is transparent. The anodes correspond to an array of pixels of tandem OLED display 100, e.g. red-emitting pixel 115a, green-emitting pixel 115b, blue-emitting pixel 115c, and broadband-emitting pixel 115d. Disposed between the anode and the cathode are N organic broadband light-emitting units 120.x (indicated as "broadband EL unit"), where N is two or more, and where two or more broadband light-emitting units produce light having different emission spectra and at least one of such broadband light-emitting units does not produce white light. Tandem OLED display 100 also includes N−1 intermediate connectors 130.x (indicated as "int. connector" in the figure) disposed between each of the adjacent broadband light-emitting units. x is an integer variable between 1 and N for 120.x and between 1 and N−1 for 130.x. The broadband light-emitting units 120.x, stacked and connected serially, are designated 120.1 to 120.N where 120.1 is the first broadband light-emitting unit (adjacent to the anode), 120.2 is the second broadband light-emitting unit, and 120.N is the $N^{th}$ broadband light-emitting unit (closest to the cathode). The term 120.x represents any of the broadband light-emitting units named from 120.1 to 120.N in the present invention. The connectors 130.x are disposed between each of the broadband light-emitting units and are designated 130.1 to 130.(N−1) where 130.1 is the first connecting layer disposed between broadband light-emitting units 120.1 and 120.2, and 130.(N−1) is the last connecting layer disposed between broadband light-emitting units 120.(N−1) and 120.N. The term 130.x represents any of the intermediate connectors named from 130.1 to 130.(N−1) in the present invention. There are a total of N−1 intermediate connectors associated with N broadband light-emitting units.

The tandem OLED display 100 is externally connected to a voltage/current source through electrical conductors (not shown) and is operated by applying an electric potential produced by a voltage/current source between a pair of contact electrodes, e.g. anode 110a and cathode 170. Under a forward bias, this externally applied electrical potential is distributed among the 2N broadband light-emitting units and the 2N-1 intermediate connectors in proportion to the electrical resistance of each of these units and layers. The electric potential across the tandem white OLED causes holes (positively charged carriers) to be injected from anode 110a into the $1^{st}$ broadband light-emitting unit 120.1, and electrons (negatively charged carriers) to be injected from cathode 170 into the $N^{th}$ broadband light-emitting unit 120.N. Simultaneously, electrons and holes are produced in, and separated from, each of the intermediate connectors, (130.1-130.(N-1)). Electrons thus produced, for example, in connecting layer 130.1 are injected towards the anode and into the adjacent broadband light-emitting unit 120.1. Likewise, holes produced in the connecting layer 130.1 are injected towards the cathode and into the adjacent broadband light-emitting unit 120.2. Subsequently, these electrons and holes recombine in their corresponding light-emitting units to produce light.

Each broadband light-emitting unit in the tandem OLED display 100 is capable of supporting hole transport, electron transport, and electron-hole recombination to produce light. Each light-emitting unit can comprise a plurality of layers. There are many organic light-emitting multilayer structures known in the art that are used as the broadband EL unit of the present invention. These include hole-transporting layer (HTL)/one or more light-emitting layers (LEL or LELs)/ electron-transporting layer (ETL), hole-injecting layer (HIL)/HTL/(LEL or LELs)/ETL, HIL/HTL/(LEL or LELs)/ ETL/electron-injecting layer (EIL), HIL/HTL/electron-blocking layer or hole-blocking layer/(LEL or LELs)/ETL/ EIL, and HIL/HTL/(LEL or LELs)/hole-blocking layer/ETL/ EIL. Each broadband light-emitting unit in the tandem OLED display can have the same or different layer structures from other light-emitting units provided that the combined emission would be an improved broadband emission. In some instances, when the thickness of the LEL adjacent to the ETL is thicker than 20 nm, the ETL is simply replaced by an EIL, and the EIL then serves the function of supporting both electron injection and electron transportation.

When the number of the LELs within a specific broadband light-emitting unit in the tandem OLED display 100 is considered, the number of LELs are typically from 1 to 3. Therefore, in one embodiment the broadband light-emitting unit can include at least one HTL and three LELs, wherein each of the LELs has different color emission. The broadband light-emitting unit can also include at least one HTL and two LELs, wherein each of the LELs has different color emission. The broadband light-emitting unit can also include at least one HTL and one LEL having broadband emission. The light-emitting layers are selected such that each broadband light-emitting unit produces light that has two or more spaced peak spectral components in more than a single region of the visible spectrum, e.g. blue and green, blue and red, green and red, or cyan and yellow. The LELs in each of the broadband light-emitting units can have the same or different color emission, however at least two of the broadband light-emitting units should have different color emission and at least one of the broadband light-emitting units should not be white, e.g. two magenta units comprising blue and red peaks and one orange unit comprising green and red peaks or one white unit comprising blue, green and red peaks, one cyan unit comprising blue and green peaks, and one orange unit comprising green and red peaks. In some embodiments, none of the broadband light-emitting units individually produce white light. For some of these embodiments, the combined emissions of the broadband light-emitting units will form white light, e.g. a cyan unit and an orange unit. For other of these embodiments, the combined emissions will not form white light, e.g. one cyan unit that includes a greater blue peak and a lesser green peak and one cyan unit that includes a greater green peak and a lesser blue peak.

The organic layers in the broadband light-emitting units are formed from small molecule OLED materials or polymeric LED materials, both known in the art, or combinations thereof. The corresponding organic layer in each light-emitting unit in the tandem OLED display is formed using the same materials as or different materials from those of the other corresponding organic layers. Some light-emitting units are polymeric and other units are small molecules (or non-polymeric), including fluorescent materials and phosphorescent materials.

The materials used to construct the broadband light-emitting units are the same materials as used to construct the conventional white OLEDs. White-emitting devices are described, for example, in EP 1 187 235, EP 1 182 244, U.S. Pat. Nos. 5,683,823, 5,503,910, 5,405,709, 5,283,182, 6,627, 333, 6,696,177, 6,720,092, U.S. Patent Application Publications 2002/0186214 A1, 2002/0025419 A1, 2004/0009367 A1 and U.S. patent application Ser. No. 10/882,834 filed Jan. 5, 2004 entitled "High Performance White Light-Emitting OLED Device" by Hatwar et al., the disclosures of which are incorporated herein by reference. In preferred embodiments, broadband light is produced by multiple LELs.

Each broadband light-emitting unit is selected in order to improve performance or achieve a desired attribute, for example, light transmission through the OLED multilayer structure, drive voltage, luminance efficiency, manufacturability, and device stability. The number of light-emitting units in the tandem OLED display is, in principle, equal to or more than 2. Preferably, the number of the light-emitting units in the tandem OLED display is such that the luminance efficiency in units of cd/A is improved or maximized.

In order to reduce drive voltage for the tandem OLED display, it is desirable to make each light-emitting unit as thin as possible without compromising the electroluminescence efficiency. It is preferable that each light-emitting unit is less than 500 nm thick, and more preferable that it be 2-250 nm thick. It is also preferable that each layer within the light-emitting unit be 200 nm thick or less, and more preferable that it be 0.1-100 nm. It is also preferable that the thickness of each LEL in the light-emitting unit be in the range of from 5 nm to 50 nm.

An array of color modifying media is associated with tandem OLED display 100. The array of color modifying media receives light from the broadband light-emitting units. Color modifying media are color filters that restrict passage of light to only a portion of the visible spectrum, color change modules that absorb light in one region of the spectrum and re-emit the light in a different portion of the spectrum, or combinations of color filters and color change modules. Although the array of color modifying media can have a variety of combinations, a useful combination includes media of the three primary colors, that is red color modifying medium 105a whose bandpass is selected to permit red light to pass or be emitted, green color modifying medium 105b whose bandpass is selected to permit green light to pass or be emitted, and blue color modifying medium 105c whose bandpass is selected to permit blue light to pass or be emitted, so that the array of color modifying media can produce a wide gamut of colors, including white light. For example, if a current passes between anode 110a and cathode 170, broadband light will be produced that will be modified by red color modifying medium 105a, thus producing red light to the observer. Several types of color modifying media are known in the art. One type of color modifying medium is formed on a second transparent substrate and then aligned with the pixels of the first substrate 150. An alternative type of color modifying medium is formed directly over the elements of a pixel as in FIG. 1. In a display comprising multiple pixels, the space between the individual color modifying media elements can also be filled with a black matrix to reduce pixel cross talk and improve the display's contrast.

Figure 2A:
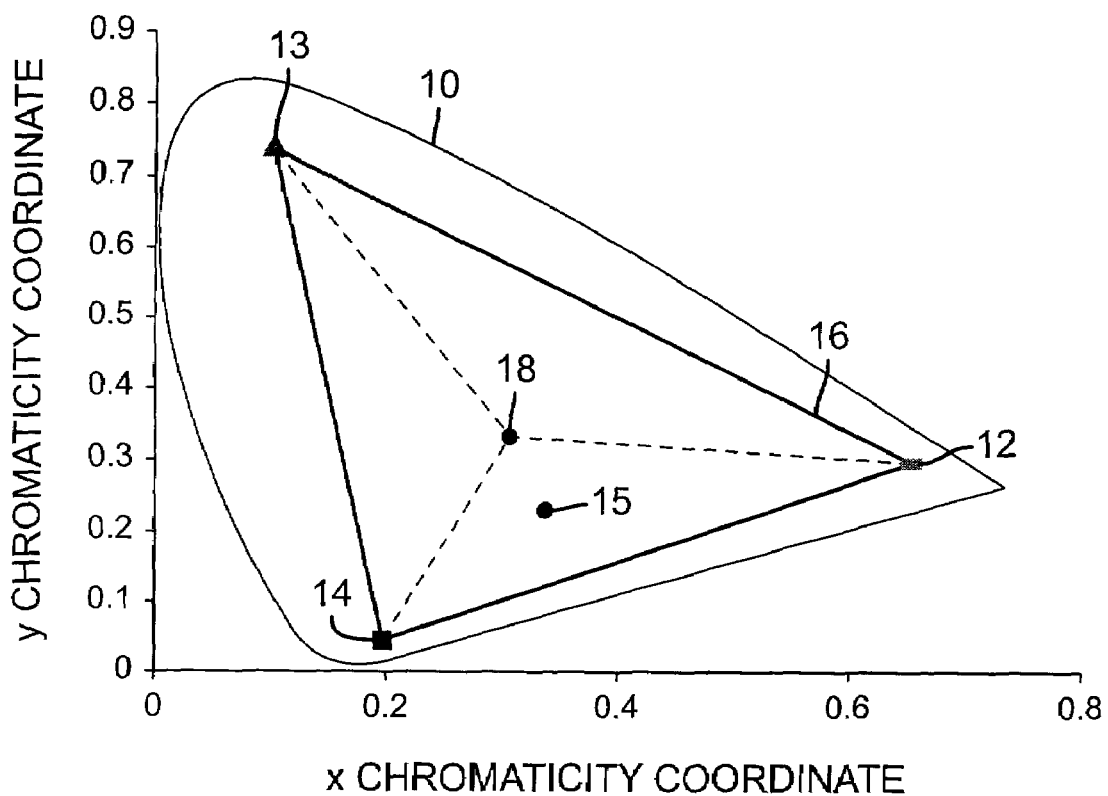
FIG. 2a shows a 1931 CIE (Commission Internationale d'Éclairage) x,y-chromaticity diagram of a light-emitting device with three color-gamut-defining pixels, and one within-gamut pixel.

Different colored pixels can include different color modifying media. That is, green color modifying medium 105b and blue color modifying medium 105c are color filters, while red color modifying medium 105a is a color change module or combination color change module and color filter. Tandem OLED display 100 can include one or more pixels without a color modifying medium, e.g. broadband-emitting pixel 115d, which will emit broadband light. This can lead to a wide variety of embodiments of this type. For example, in one embodiment, the combined emissions of the broadband light-emitting units of tandem OLED display 100 can form white light. Color modifying media 105a, 105b, and 105c are color filters that restrict the light emission to red, green, and blue, respectively. The respective pixels determine the color gamut of the display. Broadband-emitting pixel 115d emits the combined white emission, and is thereby a within-gamut pixel. The color gamut is shown schematically in FIG. 2a, which is a 1931 CIE (Commission Internationale d'Éclairage) x,y-chromaticity diagram of a light-emitting device with three color-gamut-defining pixels and one within-gamut pixel. At least three pixels emit different colors, e.g. red emitter 12, green emitter 13, and blue emitter 14, which define the color gamut 16 of the display in CIE color space 10. By illuminating two or more of the color-gamut-defining pixels to varying intensities, other colors are produced. These new colors are within-gamut colors. Such a display device also has at least one additional pixel that emits a within-gamut color light, e.g. white emitter 18. The term white is used in the present invention to indicate any light emission that is perceived as approximately white to a viewer. The within-gamut pixel, however, is any color within the gamut of the color-gamut-defining pixels and the term RGBW is used herein to describe any display having at least three color-gamut-defining pixels and at least one within-gamut pixel. This type of display is more efficient than conventional OLED displays because the within-gamut pixels tend to have higher efficiency than at least one of the color-gamut-defining pixels. Typically, the within-gamut pixel is more efficient than all of the color-gamut-defining pixels.

In this configuration, the added emitter produces a series of sub-gamuts (shown by the dashed lines in FIG. 2a) comprising white emitter 18 and two of the other three emitters. The sub-gamuts together form color gamut 16. Thus, although one can produce a desired color 15 from an appropriate combination of red emitter 12, green emitter 13, and blue emitter 14, it is more efficient to produce it by an appropriate combination of red emitter 12, blue emitter 14, and white emitter 18.

Figure 2B:
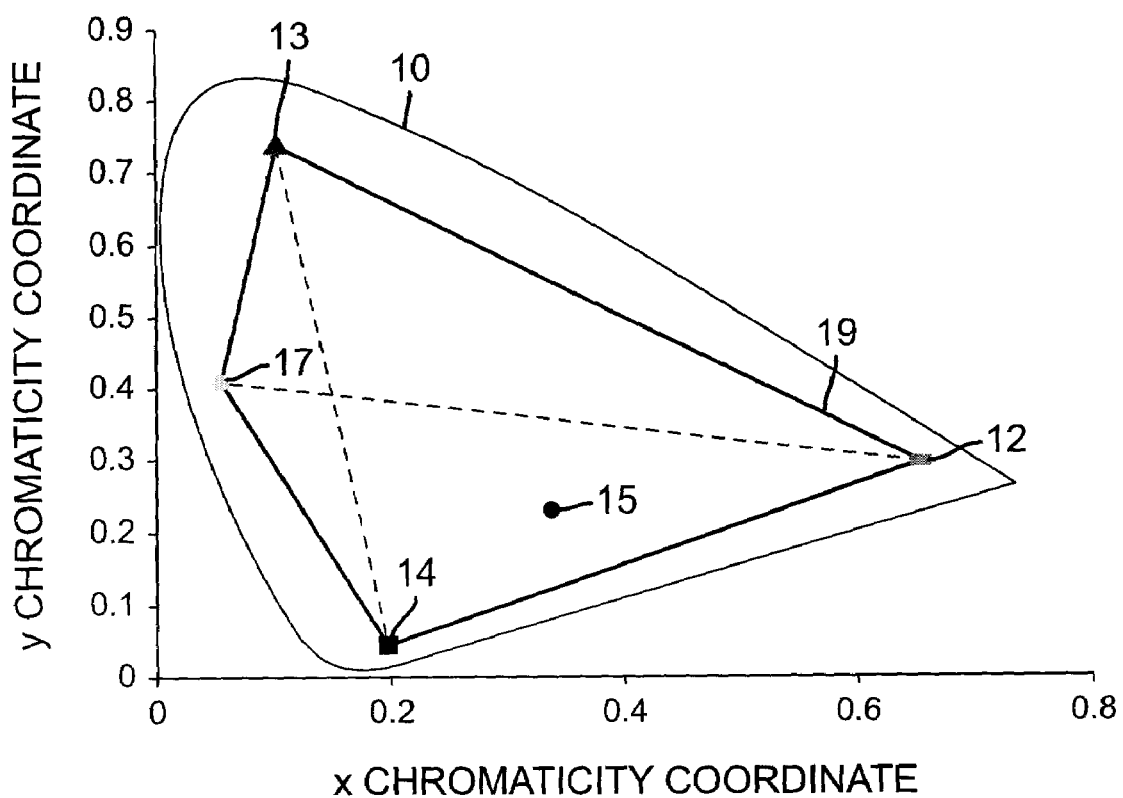
FIG. 2b shows a 1931 CIE x,y-chromaticity diagram of a light-emitting device with four color-gamut-defining pixels.

In another embodiment, the combined emission of the broadband light-emitting units of tandem OLED display 100 can form cyan light, that is comprising blue and green light. Color modifying media 105b, and 105c are color filters that restrict the light emission to green and blue, respectively, while color modifying medium 105a is color change module that converts all or a portion of the cyan emission to red light. Broadband-emitting pixel 115d emits the combined cyan emission, and provides a fourth gamut pixel. The respective pixels determine the color gamut of the display. The color gamut is shown schematically in FIG. 2b, which is an example of a display with added color-gamut-defining pixels in what is called an RGBC device. Besides red emitter 12, green emitter 13, and blue emitter 14, such a device includes cyan emitter 17, which emits outside the color gamut defined by the other three pixels. Such a device has the advantage that it can define an extended color gamut 19.

In this configuration, the added emitter produces a series of sub-gamuts (shown by the dashed lines of FIG. 2b) comprising three of the four emitters. Each sub-gamut overlaps with others. Thus, one can produce a desired color 15 from an appropriate combination of red emitter 12, green emitter 13, and blue emitter 14; or an appropriate combination of red emitter 12, cyan emitter 17, and blue emitter 14; or an appropriate combination of all four emitters.

Other embodiments are possible with this architecture, as long as they include at least three different colored gamut pixels. The gamut pixels are all color-modified (e.g. pixels 115a, 115b, and 115c) or can include color-modified and unmodified pixels (e.g. pixels 115b, 115c, and 115d).

Figure 3B:
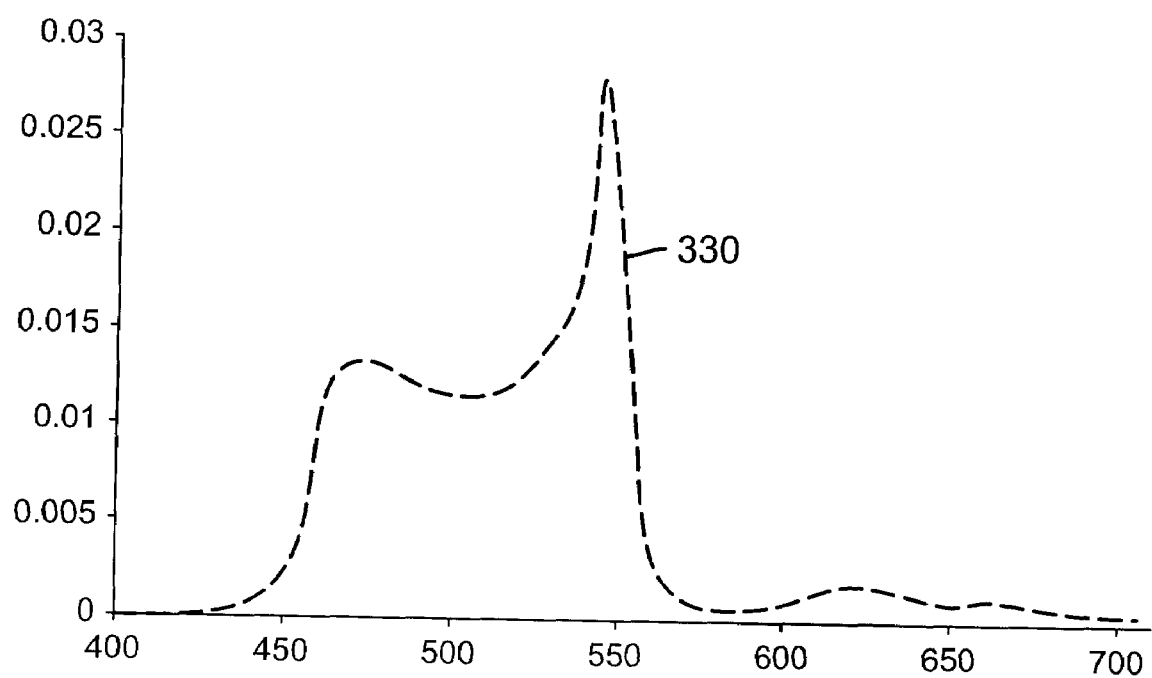
FIG. 3b shows an emission spectrum of one embodiment of a cyan broadband light-emitting unit.
Figure 3C:
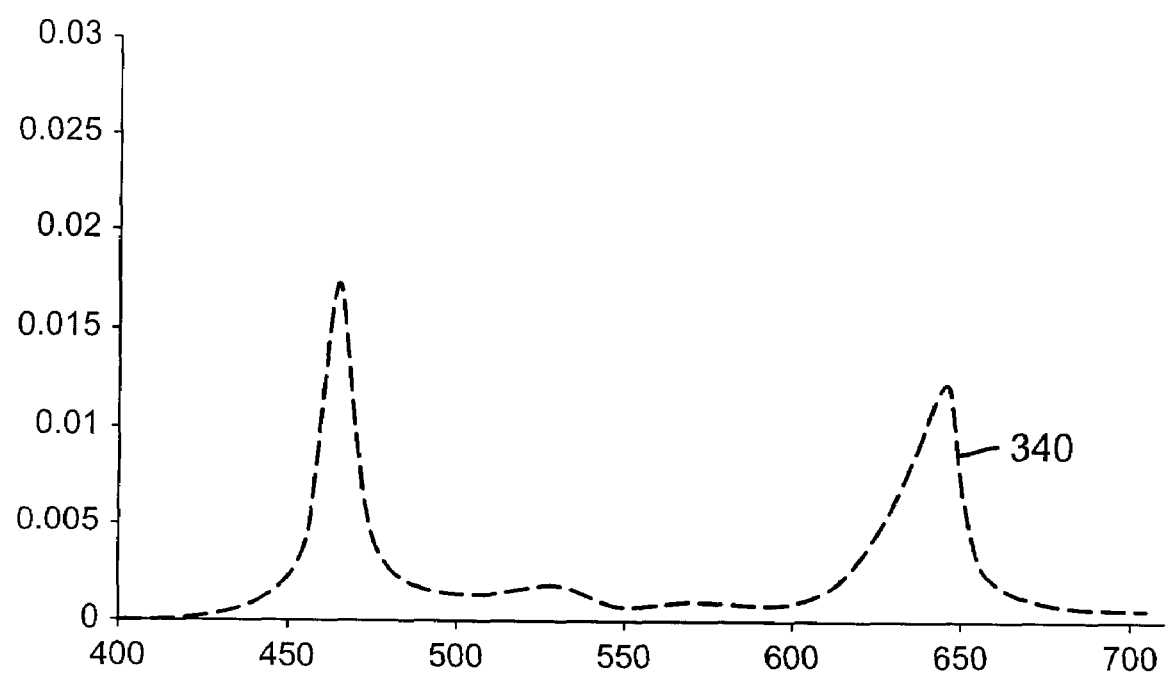
FIG. 3c shows an emission spectrum of one embodiment of a magenta broadband light-emitting unit.
Figure 3D:
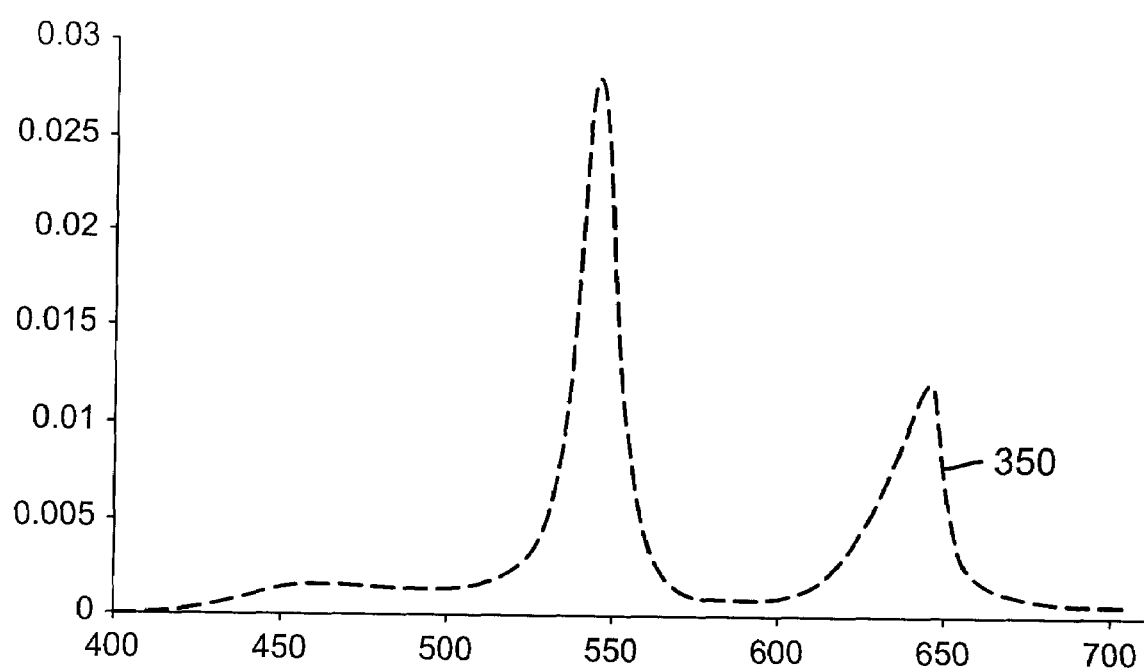
FIG. 3d shows an emission spectrum of one embodiment of a yellow broadband light-emitting unit.

Turning now to FIG. 3a to 3d, there are shown some non-limiting examples of emission spectra for the broadband light-emitting units that are useful in the present invention. FIG. 3a shows an emission spectrum of a broadband light-emitting unit that produces white light. Emission spectrum 300, which has two peak spectral components 305 and 325, has significant emission in blue region 310, green region 315, and red region 320. Such a light-emitting unit is a white emitter when unfiltered, and is used with color filters to provide red, green, and blue pixels. FIG. 3b shows emission spectrum 330 of a cyan broadband light-emitting unit, which produces blue and green light. FIG. 3c shows emission spectrum 340 of a magenta broadband light-emitting unit, which produces blue and red light. FIG. 3d shows emission spectrum 350 of a yellow broadband light-emitting unit, which produces green and red light.

The two or more broadband light-emitting units of tandem OLED display 100 can have emission spectra similar to those of FIG. 3a through 3d. For example, one of the broadband light-emitting units can produce white light, similar to FIG. 3a, and a second broadband light-emitting unit can produce green and blue light, similar to FIG. 3b. In another embodiment, one of the broadband light-emitting units can produce white light, similar to FIG. 3a, and a second broadband light-emitting unit can produce red and blue light, similar to FIG. 3c. In another embodiment, one of the broadband light-emitting units can produce white light, similar to FIG. 3a, and a second broadband light-emitting unit can produce red and green light, similar to FIG. 3d. Embodiments are possible wherein none of the broadband light-emitting units individually produce white light. For example, one of the broadband light-emitting units can produce blue and red light, similar to FIG. 3c, and a second broadband light-emitting unit can produce green and blue light, similar to FIG. 3b. In such a case, the combined emissions of the broadband light-emitting units will form white light. It is also possible that the combined emissions of the broadband light-emitting units will not form white light.

Figure 4:
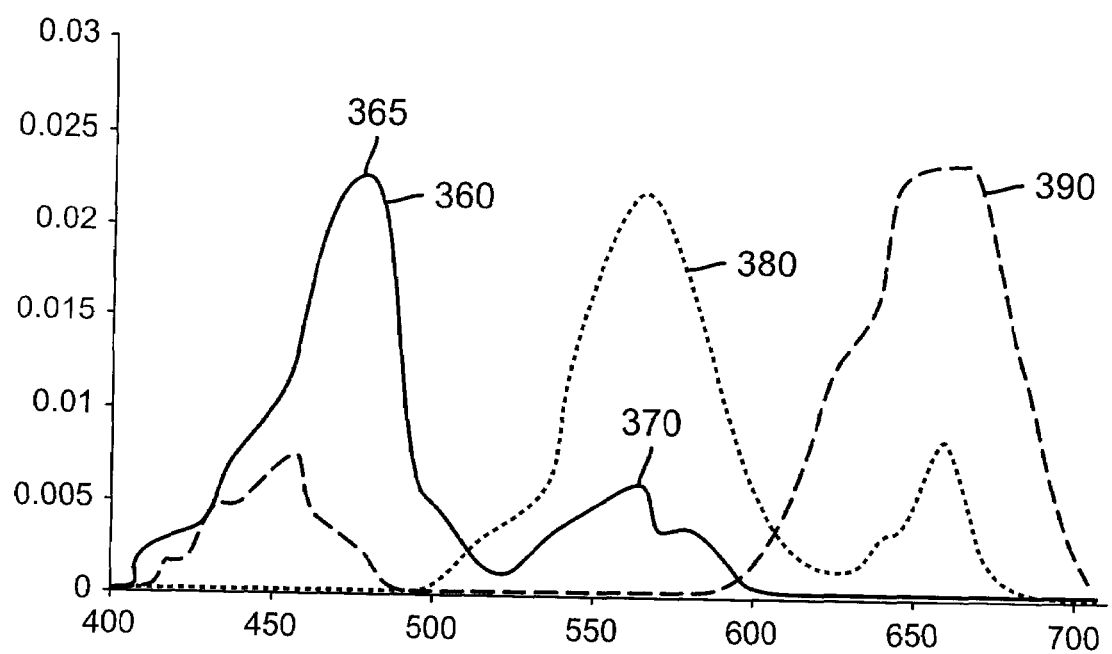
FIG. 4 shows emission spectra of several broadband light-emitting units.

Turning now to FIG. 4, there are shown emission spectra of several broadband light-emitting units in one embodiment of the present invention. At least one of the broadband light-emitting units produces an emission spectrum with a first and a second emission peak, wherein the first emission peak has a greater intensity than the second emission peak. For example, emission spectrum 360 has a first emission peak 365 of greater intensity in the blue region of the visible spectrum, and a second emission peak 370 of lesser intensity in the green region. Similarly, emission spectrum 380 has a first peak of greater intensity in the green region and a second peak of lesser intensity in the red region, and emission spectrum 390 has a first peak of greater intensity in the red region and a second peak of lesser intensity in the blue region. The first emission peaks of the broadband light-emitting units are selected so that the combined emission produces white light, that is light in the red, green, and blue regions, as shown. It is also possible that the combined emissions of the broadband light-emitting units will not form white light. For example, a first broadband light-emitting unit with emission spectrum 360 and a second broadband light-emitting unit with emission spectrum 380 can form a tandem OLED device with cyan emission.

Figure 5:
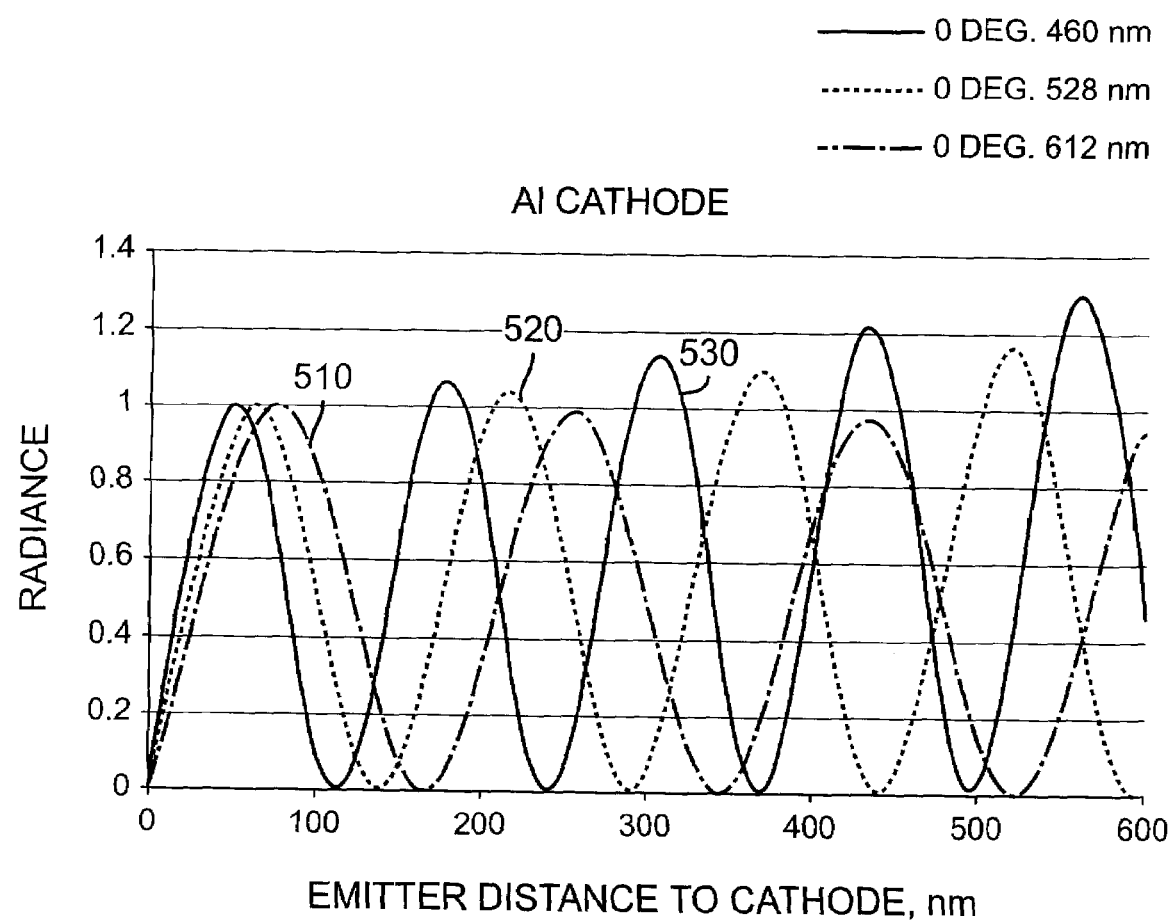
FIG. 5 shows the variation of emission intensity with the distance of the light-emitting layer to the cathode for three different wavelengths of light.

The problem of optical interference effects within the multi-layer OLED structure has already been mentioned. This is shown schematically in FIG. 5, which shows the variation of emission intensity with the distance of the light-emitting layer to the cathode for three different wavelengths of light, e.g. red (curve 510), green (curve 520), and blue (curve 530). The preferred locations for a particular light-emitting layer are wavelength dependent. In conventional tandem OLED devices using broadband light-emitting units, where the first and second emission peaks are similar in intensity, it is difficult to place all of the broadband light-emitting layers near their preferred locations for all emission peaks. Because the majority of each of the red, green, and blue emissions are provided by separate light-emitting units in this particular embodiment of a tandem OLED structure, it is an advantage that each of the light-emitting units is placed at or near their optimum location with the OLED stack.

Figure 6:
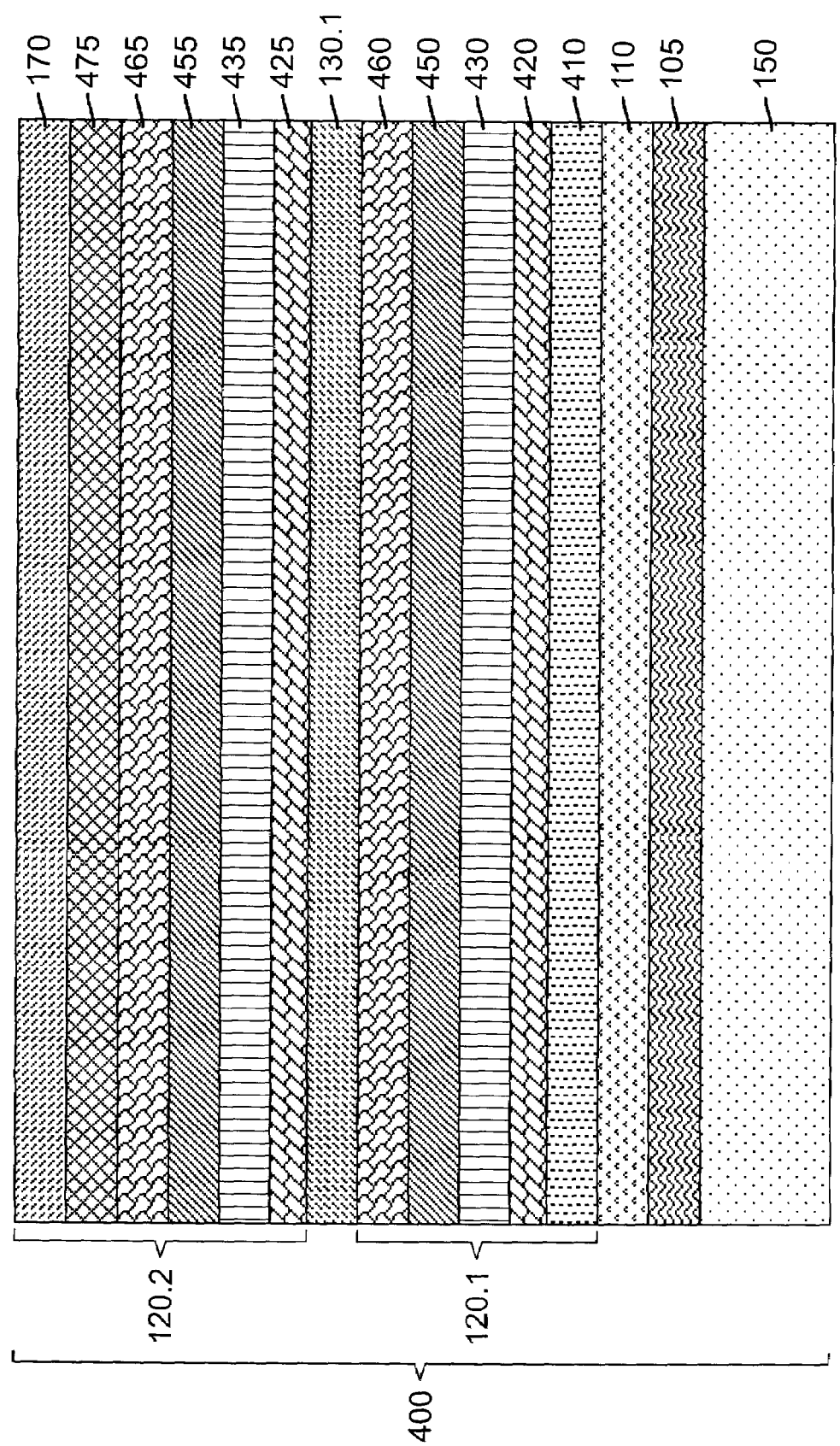
FIG. 6 shows a cross-sectional view of a single light-emitting pixel of a tandem OLED display according to the present invention.

Turning now to FIG. 6, there is shown a cross-sectional view of a single light-emitting pixel 400 of a tandem OLED display according to the present invention. Light-emitting pixel 400 is drawn as bottom-emitting, but it is top-emitting or bottom-emitting. Light-emitting pixel 400 includes a substrate 150, an anode 110, a cathode 170 spaced from anode 110, a first broadband light-emitting unit 120.1, a intermediate connector 130.1, a second broadband light-emitting unit 120.2 that is different from 120.1, and a color modifying medium 105. Each broadband light-emitting unit includes one or more light-emitting layers (e.g. light-emitting layers 430, 450, 435, and 455) and can also include a hole-injecting layer (e.g. 410), a hole-transporting layer (e.g. 420 and 425), an electron-transporting layer (e.g. 460 and 465), and an electron-injecting layer (e.g. 475). The materials for these layers are described below.

Broadband EL units such as 120.1 produce light in response to hole-electron recombination. Desired organic light-emitting materials are deposited by any suitable method such as evaporation, sputtering, chemical vapor deposition, electrochemical deposition, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. Although OLED light-emitting layers are formed from light-emitting material, they more generally comprise a host-material and a light-emitting dopant. Certain red-, yellow-, green-, and blue-light-emitting compounds are particularly useful for the present invention. Prior art displays which emit white light include emitting layers that produce a wide range of emitted wavelengths, e.g. EP 1 187 235 A2, which teaches a white-light-emitting organic electroluminescent element with a substantially continuous spectrum in the visible region of the spectrum. Other examples are described in, EP 1 182 244, U.S. Pat. Nos. 5,683,823, 5,503,910, 5,405,709, 5,283,182, 6,627,333, 6,696,177, 6,720,092, U.S. Patent Application Publications 2002/0186214 A1, 2002/0025419 A1, and 2004/0009367 A1. These will be referred to herein as broadband white emitters or broadband emitters.

The HTL contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals or at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described by VanSlyke et al. in U.S. Pat. Nos. 4,720,432 and 5,061,569. The HTL is formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-tolyl)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4''-diamino-p-terphenyl;
4,4'-Bis{N-phenyl-N-[4-(1-naphthyl)-phenyl]amino}biphenyl;
2,6-Bis[N,N-di(2-naphthyl)amino]fluorene;
4,4',4''-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1

009 041. Tertiary aromatic amines with more than two amino groups are used including oligomeric materials. In addition, polymeric hole-transporting materials are used such as poly (N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The LEL includes a luminescent fluorescent or phosphorescent material where electroluminescence is produced as a result of electron-hole pair recombination in this region. The light-emitting layer is comprised of a single material, but more commonly contains a host material doped with a guest emitting material or materials where light emission comes primarily from the emitting materials and is of any color. This guest emitting material is often referred to as a light-emitting dopant. The host materials in the light-emitting layer are electron-transporting materials, as defined below, a hole-transporting material, as defined above, or another material or combination of materials that support hole-electron recombination. The emitting material is typically chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials are small nonpolymeric molecules or polymeric materials including polyfluorenes and polyvinylarylenes, e.g., poly(p-phenylenevinylene), PPV. In the case of polymers, small molecule emitting materials is molecularly dispersed into a polymeric host, or the emitting materials are added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, 6,020,078, 6,475,648, 6,534,199, 6,661,023, U.S. Patent Application Publications 2002/0127427 A1, 2003/0198829 A1, 2003/0203234 A1, 2003/0224202 A1, and 2004/0001969 A1.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)];
CO-2: Magnesium bisoxine[alias, bis(8-quinolinolato)magnesium(II)];
CO-3: Bis[benzo{f}-8-quinolinolato]zinc(II);
CO-4: Bis(2-methyl-8-quinolinolato)aluminum(III)-m-oxo-bis(2-methyl-8-quinolinolato)aluminum(III);
CO-5: Indium trisoxine[alias, tris(8-quinolinolato)indium];
CO-6: Aluminum tris(5-methyloxine)[alias, tris(5-methyl-8-quinolinolato)aluminum(III)];
CO-7: Lithium oxine[alias, (8-quinolinolato)lithium(I)];
CO-8: Gallium oxine[alias, tris(8-quinolinolato)gallium (III)]; and
CO-9: Zirconium oxine[alias, tetra(8-quinolinolato)zirconium(IV)].

Another class of useful host materials includes derivatives of anthracene, such as those described in U.S. Pat. Nos. 5,935, 721, 5,972,247, 6,465,115, 6,534,199, 6,713,192, U.S. Patent Application Publications 2002/0048687 A1, 2003/0072966 A1, and WO 2004/018587 A1. Some examples include derivatives of 9,10-dinaphthylanthracene derivatives and 9-naphthyl-10-phenylanthracene. Other useful classes of host materials include distyrylarylene derivatives as described in U.S. Pat. No. 5,121,029, and benzazole derivatives, for example, 2,2',2"-(1,3,5-phenylene)tris[1-phenyl-1H-benzimidazole].

Desirable host materials are capable of forming a continuous film. The light-emitting layer can contain more than one host material in order to improve the device's film morphology, electrical properties, light emission efficiency, and lifetime. Mixtures of electron-transporting and hole-transporting materials are known as useful hosts. In addition, mixtures of the above listed host materials with hole-transporting or electron-transporting materials can make suitable hosts. Mixtures of anthracene derivatives with arylamine derivatives are particularly useful hosts.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrilium compounds, fluorene derivatives, periflanthene derivatives, indenoperylene derivatives, bis(azinyl)amine boron compounds, bis (azinyl)methane boron compounds, derivatives of distyrylbenzene and distyrylbiphenyl, and carbostyryl compounds. Among derivatives of distyrylbenzene, particularly useful are those substituted with diarylamino groups, informally known as distyrylamines.

Suitable host materials for phosphorescent emitters (including materials that emit from a triplet excited state, i.e., so-called "triplet emitters") should be selected so that the triplet exciton is transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles, and carbazole compounds. Examples of desirable hosts are 4,4'-N, N'-dicarbazole-biphenyl (CBP), 2,2'-dimethyl-4,4'-N,N'-dicarbazole-biphenyl, m-(N,N'-dicarbazole)benzene, and poly (N-vinylcarbazole), including their derivatives.

Examples of useful phosphorescent materials that are used in light-emitting layers of the present invention include, but are not limited to, those described in WO 00/57676 A1, WO 00/70655 A1, WO 01/41512 A1, WO 02/15645 A1, WO 01/93642 A1, WO 01/39234 A2, WO 02/074015 A2, WO 02/071813 A1, U.S. Pat. Nos. 6,458,475, 6,573,651, 6,451, 455, 6,413,656, 6,515,298, 6,451,415, 6,097,147, U.S. Patent Application Publications 2003/0017361 A1, 2002/0197511 A1, 2003/0072964 A1, 2003/0068528 A1, 2003/0124381 A1, 2003/0059646 A1, 2003/0054198 A1, 2002/0100906 A1, 2003/0068526 A1, 2003/0068535 A1, 2003/0141809 A1, 2003/0040627 A1, 2002/0121638 A1, EP 1 239 526 A2, EP 1 238 981 A2, EP 1 244 155 A2, JP 2003/073387A, JP 2003/073388A, JP 2003/059667A, and JP 2003/073665A. Useful phosphorescent dopants include, but are not limited to, transition metal complexes, such as iridium and platinum complexes.

Examples of useful red light-emitting compound include a diindenoperylene compound of the following structure:

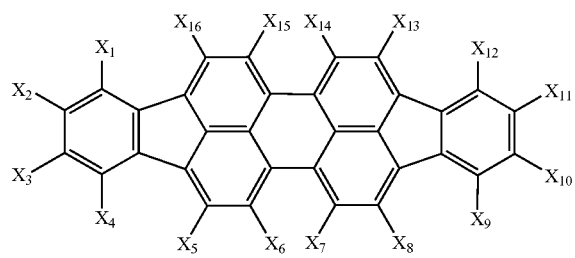

A1 wherein:

$X_1$-$X_{16}$ are independently selected as hydrogen or substituents that include alkyl groups of from 1 to 24 carbon atoms;

aryl or substituted aryl groups of from 5 to 20 carbon atoms; hydrocarbon groups containing 4 to 24 carbon atoms that complete one or more fused aromatic rings or ring systems; or halogen.

Illustrative examples of useful red dopants of this class include the following:

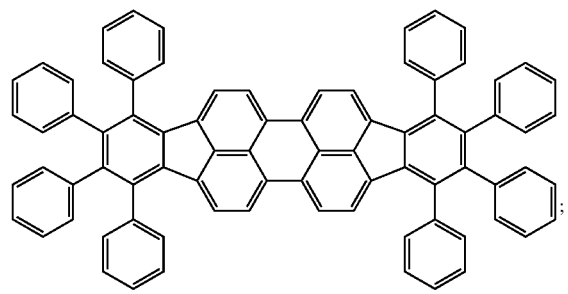

A3

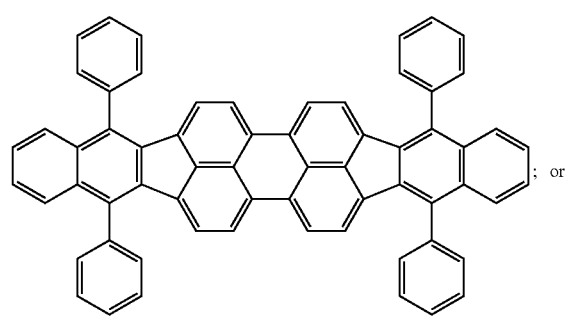

A4

TPDBP,

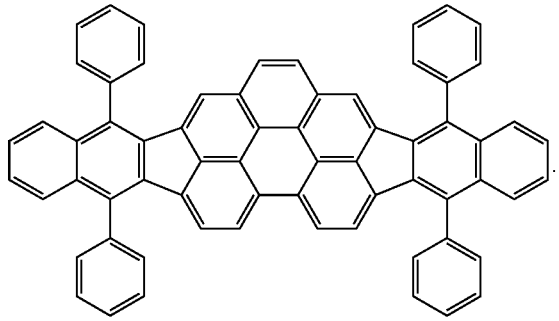

A5

A particularly preferred diindenoperylene dopant is TPDBP (A4 above). Other red dopants useful in the present invention belong to the DCM class of dyes represented by:

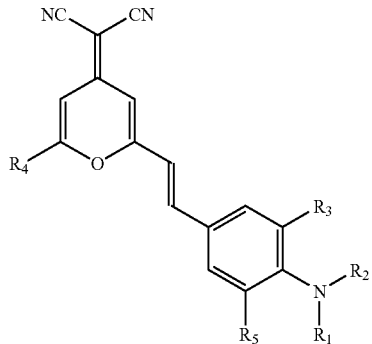

(Formula B1)

wherein:

$R_1$-$R_5$ represent one or more groups independently selected from hydro, alkyl, substituted alkyl, aryl, or substituted aryl;

$R_1$-$R_5$ independently include acyclic groups or are joined pairwise to form one or more fused rings; provided that $R_3$ and $R_5$ do not together form a fused ring.

In a useful and convenient embodiment that provides red alkyl and aryl. luminescence, $R_1$-$R_5$ are selected independently from: hydro, Structures of particularly useful dopants of the DCM class are shown below:

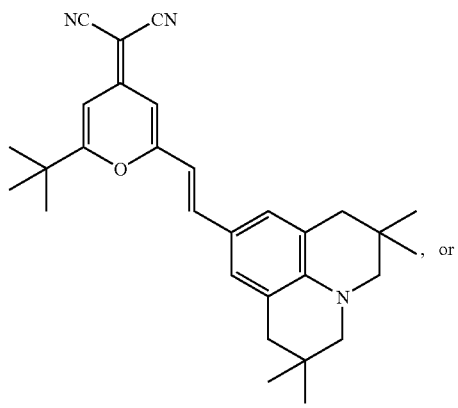

B2

DCJTB;

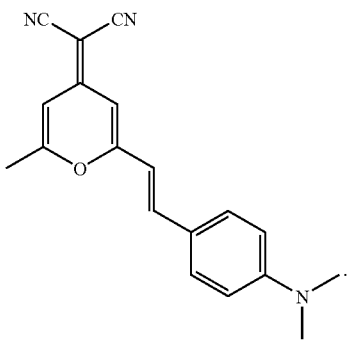

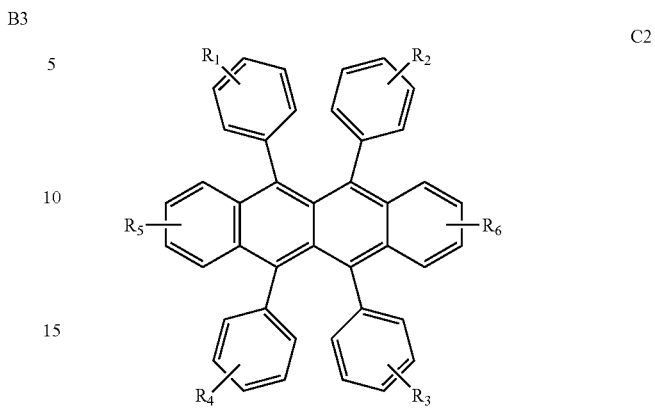

A preferred DCM dopant is DCJTB. Hatwar et al. in U.S. patent application Ser. No. 10/751,352 filed Jan. 5, 2004, the disclosure of which are incorporated herein by reference, have disclosed other DCM dopants useful for broadband emission. The red dopant can also be a mixture of compounds that would also be red dopants individually.

Certain orange or yellow light-emitting materials are useful, such as compounds of the following structures:

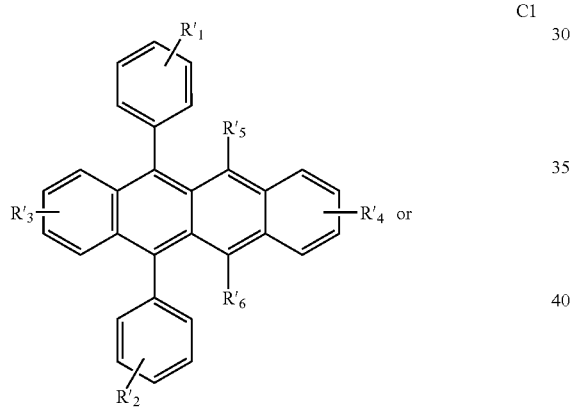

wherein $R_1$-$R_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful dopants of this class are shown below:

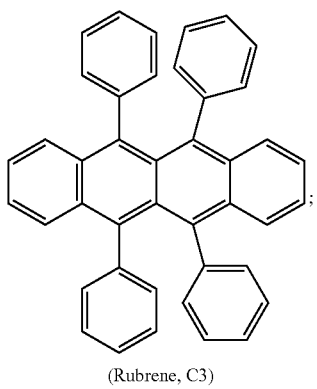

(Rubrene, C3)

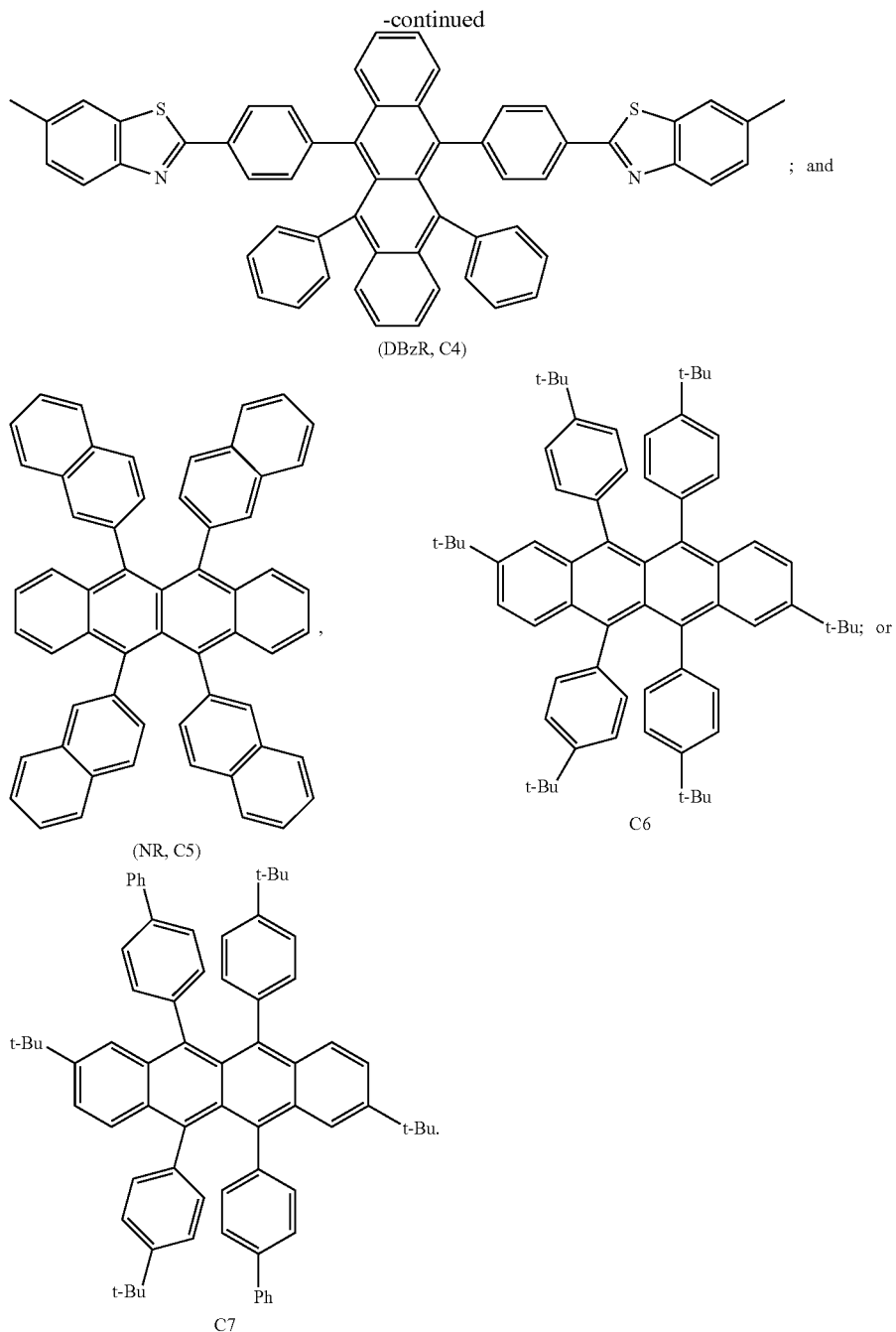

Useful green light-emitting materials can include a quinacridone compound of the following structure:

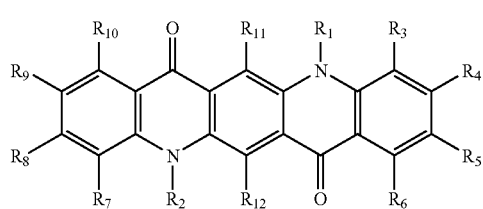

wherein substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, between 510 nm and 540 nm, and a full width at half maximum of 40 nm or less. Alkyl, alkoxyl, aryl, heteroaryl, fused aromatic ring and fused heteroaromatic ring substituent groups are further substituted. Conveniently, $R_1$ and $R_2$ are aryl, and $R_2$ through $R_{12}$ are hydrogen, or substituent groups that are more electron withdrawing than methyl. Some examples of useful quinacridones include those disclosed in U.S. Pat. No. 5,593,788 and in U.S. Patent Application Publication 2004/0001969 A1.

Examples of useful quinacridone green dopants include:

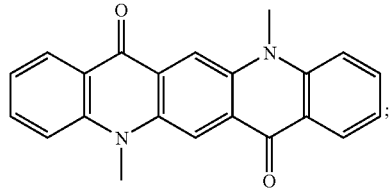
D2

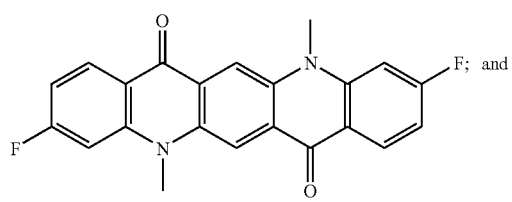
D3

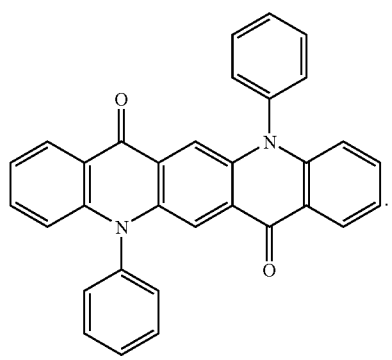
D4

The green light-emitting materials can include a coumarin compound of the following structure:

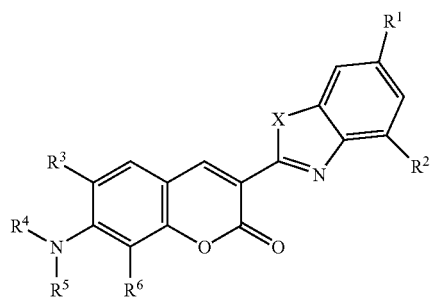
E1 wherein:
  X is O or S, $R^1$, $R^2$, $R^3$ and $R^6$ can individually be hydrogen, alkyl, or aryl;
  $R^4$ and $R^5$ can individually be alkyl or aryl, or where either $R^3$ and $R^4$; or
  $R^5$ and $R^6$, or both together represent the atoms completing a cycloalkyl group.

Examples of useful coumarin green dopants include:

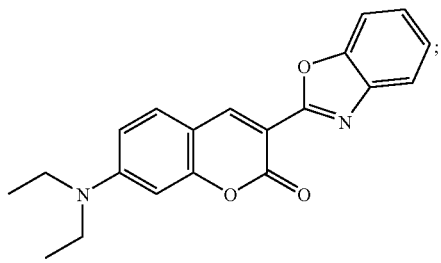
E2

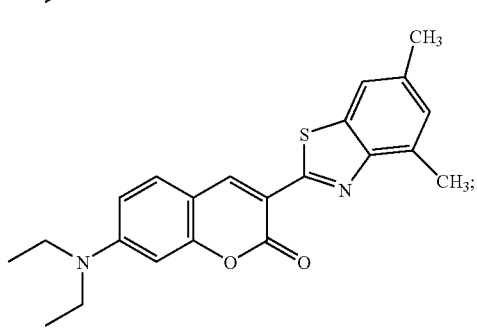
E3

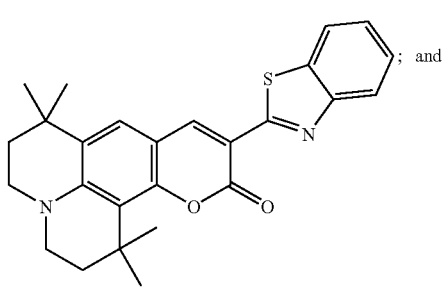
E4

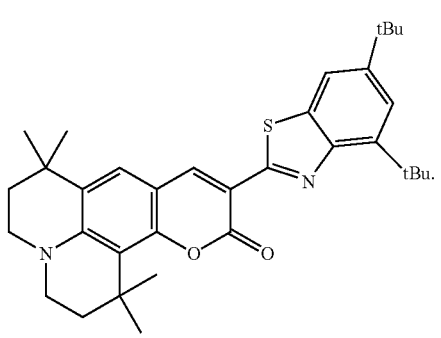
E5

Useful blue-light-emitting materials can include a bis(azinyl)azene boron complex compound of the structure F1:

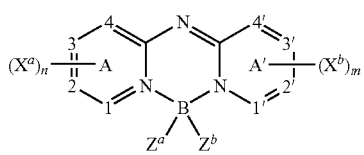
F1 wherein:
  A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Some examples of the above class of dopants include the following:

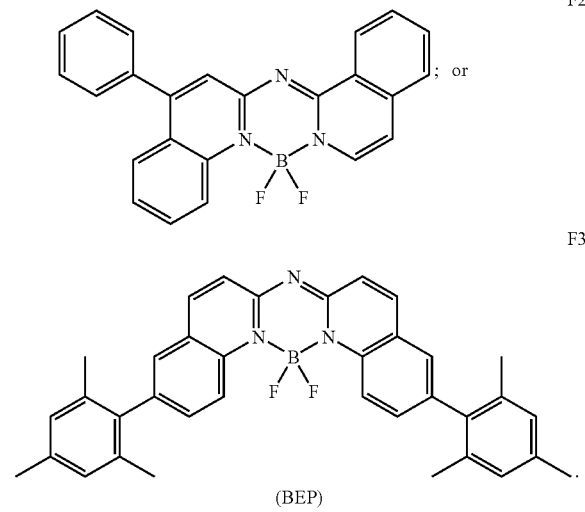

(BEP)

Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure shown below:

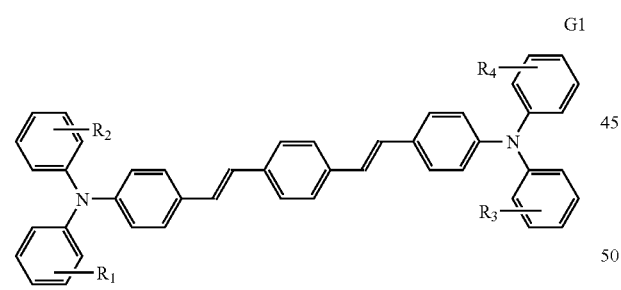

and bis[2-[4-[N,N-diarylamino]phenyl]vinyl]biphenyls of the general structure shown below:

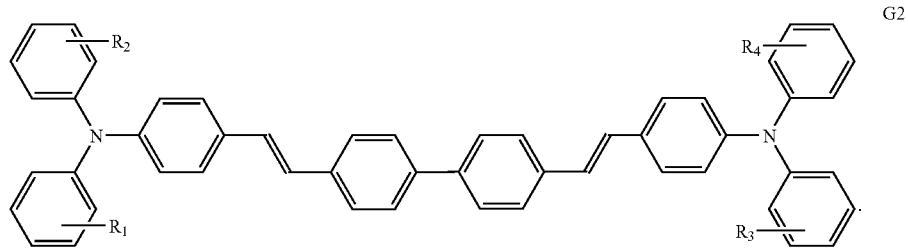

In Formulas G1 and G2, $R_1$-$R_4$ are the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BDTAPVB, Formula G3 below).

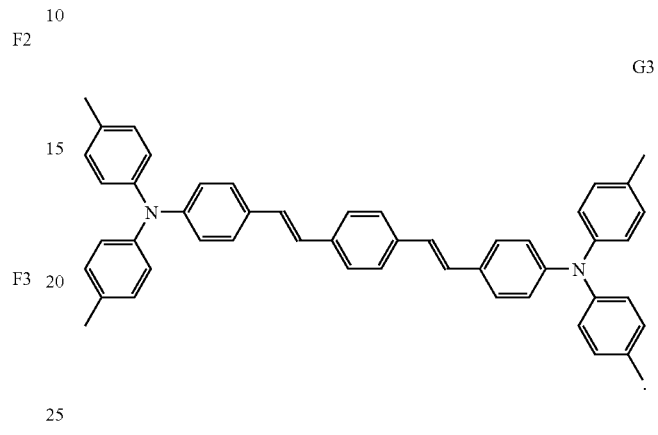

Another particularly useful class of blue dopants includes perylene or derivatives of perylene, including, but not limited to, the following:

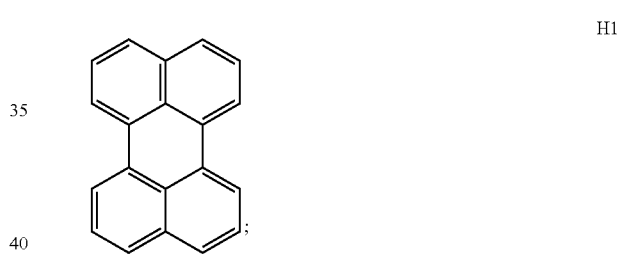

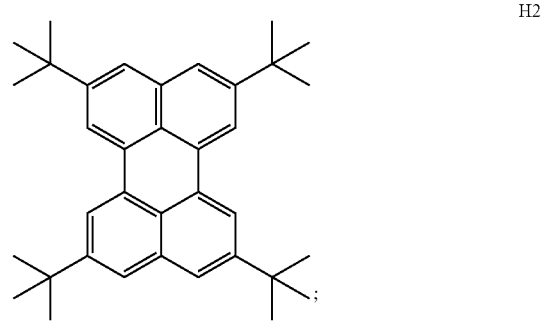

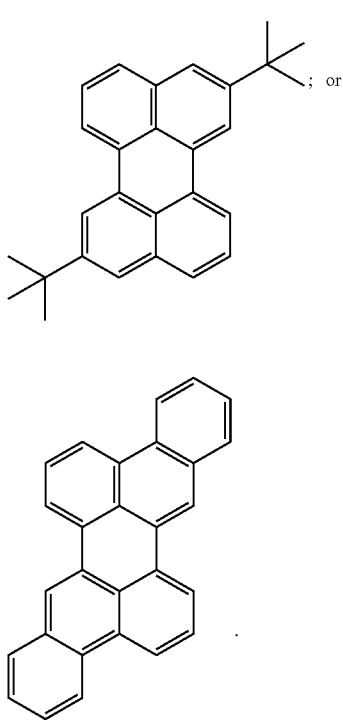

The host material in one or more of the light-emitting layers of the present invention is an anthracene derivative having hydrocarbon or substituted hydrocarbon substituents at the 9 and 10 positions. For example, derivatives of 9,10-di-(2-naphthyl)anthracene (Formula J1) constitute one class of useful host materials capable of supporting electroluminescence, and are particularly suitable for light emission of wavelengths longer than 400 nm, e.g., blue, green, yellow, orange or red

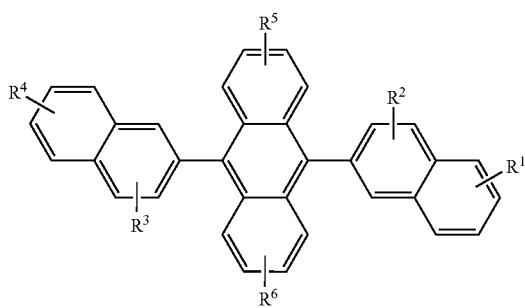

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

The monoanthracene derivative of Formula (J2) is also a useful host material capable of supporting electroluminescence, and are particularly suitable for light emission of wavelengths longer than 400 nm, e.g., blue, green, yellow, orange or red. Anthracene derivatives of Formula (J2) are described in commonly assigned U.S. patent application Ser. No. 10/950,614 filed Sep. 27, 2004 by Lelia Cosimbescu et al., entitled "Electroluminescent Device With Anthracene Derivative Host", the disclosure of which is herein incorporated by reference,

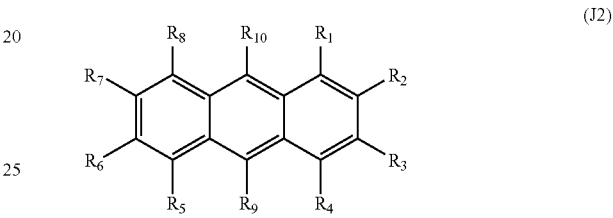

wherein:
$R_1$-$R_8$ are H;
$R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthenyl, or perylenyl group, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl that is unsubstituted or substituted in the para position; and
$R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula:

A1-L-A2    (J3)

wherein A1 and A2 each represent a substituted or unsubstituted monophenylanthryl group or a substituted or unsubstituted diphenylanthryl group and are the same with or different from each other and L represents a single bond or a divalent linking group.

Another useful class of anthracene derivatives is represented by general formula:

A3-An-A4    (J4)

wherein An represents a substituted or unsubstituted divalent anthracene residue group, A 3 and A 4 each represent a substituted or unsubstituted monovalent condensed aromatic ring group or a substituted or unsubstituted noncondensed ring aryl group having 6 or more carbon atoms and is the same with or different from each other. Specific examples of useful anthracene materials for use in a light-emitting layer include:

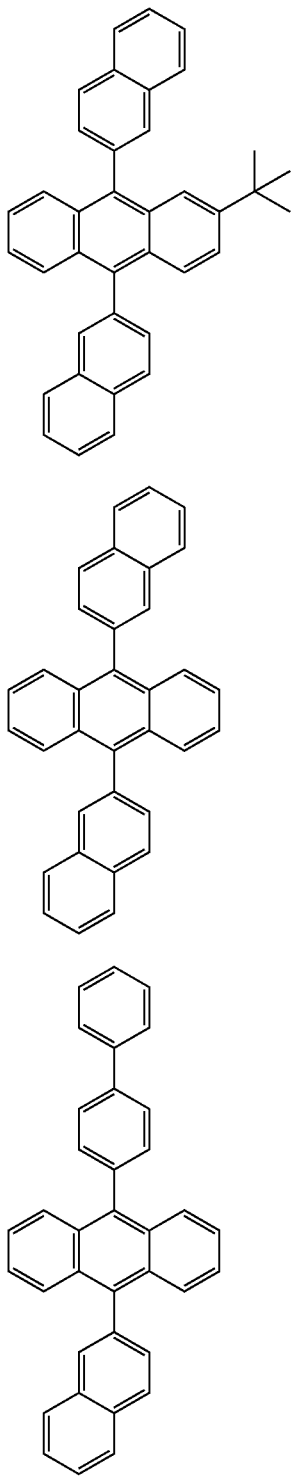

AH1

AH2

AH3

-continued

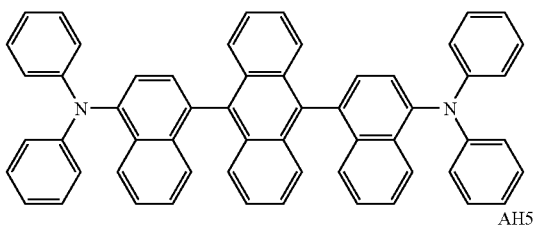

AH4

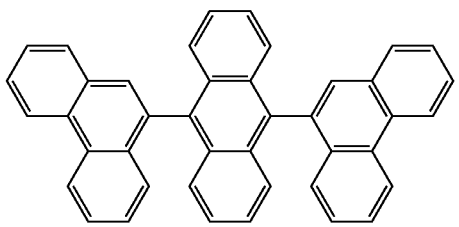

AH5

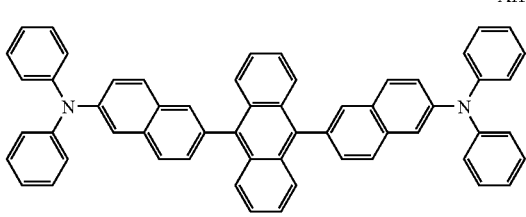

AH6

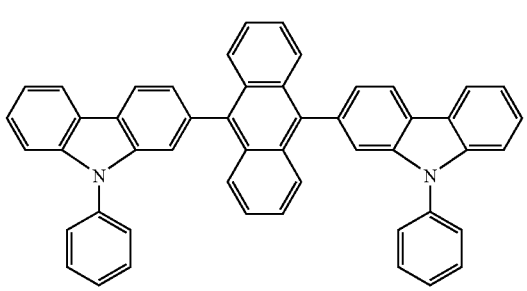

AH7

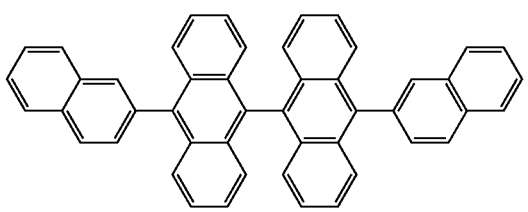

AH8

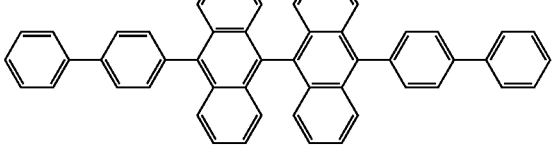

AH9

The ETL can contain one or more metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds have been listed above from CO-1 to CO-9.

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

For a tandem OLED to function efficiently, it is preferable that an intermediate connector be provided between organic EL units. The intermediate connector provides effective carrier injection into the adjacent EL units. Metals, metal compounds, or other inorganic compounds are effective for carrier injection. However, such materials often have low resistivity, which can result in pixel crosstalk. Also, the optical transparency of the layers constituting the intermediate connector should be as high as possible to permit for radiation produced in the EL units to exit the device. Therefore, it is often preferred to use mainly organic materials in the intermediate connector. There are several useful configurations for the intermediate connector. Some nonlimiting examples of intermediate connectors are described in U.S. Pat. Nos. 6,717,358 and 6,872,472, and U.S. Patent Application Publication 2004/0227460 A1.

Preferably, intermediate connector includes an n-type doped organic layer or a p-type doped organic layer or both. One useful intermediate connector has two layers including an n-type doped organic layer and an electron-accepting layer. The electron-accepting layer is disposed closer to the cathode than the n-type doped organic layer. These two layers are in contact, or an interfacial layer can separate them. The intermediate connector can include a p-type doped organic layer disposed over the electron-accepting layer. The p-type doped organic layer is closer to the cathode than the electron-accepting layer. In this configuration, the p-type doped organic layer is preferably in contact with the electron-accepting layer. The intermediate connector can have both an interfacial layer and a p-type doped organic layer. Alternatively, the intermediate connector can include: an n-type doped organic layer adjacent to a p-type doped organic layer; an n-type doped organic layer and an interfacial layer; an n-type doped organic layer, an interfacial layer, and an p-type doped organic layer.

The n-type doped organic layer contains at least one electron-transporting material as a host material and at least one n-type dopant. The term "n-type doped organic layer" means that this layer has semiconducting properties after doping, and the electrical current through this layer is substantially carried by the electrons. The host material is capable of supporting electron injection and electron transport. The electron-transporting materials defined previously for use in the ETL represent a useful class of host materials for the n-type doped organic layer. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by VanSlyke et al. in U.S. Pat. No. 4,539,507, triazines, hydroxyquinoline derivatives, benzazole derivatives, and phenanthroline derivatives. Silole derivatives, such as 2,5-bis(2',2"-bipyridin-6-yl)-1,1-dimethyl-3,4-diphenylsilacyclopentadiene are also useful host organic materials. In some instances it is useful to combine two or more hosts to obtain the proper charge injection and stability properties. More specific examples of useful host materials in the n-type organic doped layer include Alq, 4,7-diphenyl-1,10-phenanthroline (Bphen), or 2,9-dimethyl-4,7-diphenyl-1,10-phenanthroline (BCP), or combinations thereof.

The n-type dopant in the n-type doped organic layer includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped organic layer also include organic reducing agents with strong electron-donating properties. By "strong electron-donating properties" it is meant that the organic dopant should be able to donate at least some electronic charge to the host to form a charge-transfer complex with the host. Nonlimiting examples of organic molecules include bis(ethylenedithio)-tetrathiafulvalene (BEDT-TTF), tetrathiafulvalene (TTF), and their derivatives. In the case of polymeric hosts, the dopant is any of the above or also a material molecularly dispersed or copolymerized with the host as a minor component. Preferably, the n-type dopant in the n-type doped organic layer includes Li, Na, K, Rb, Cs, Mg, Ca, Sr, Ba, La, Ce, Nd, Sm, Eu, Th, Dy, or Yb, or combinations thereof. The n-type doped concentration is preferably in the range of 0.01-20% by volume. The thickness of the n-type doped organic layer is typically less than 200 nm, and preferably less than 100 nm.

The electron-accepting layer (if used) of the intermediate connector includes one or more organic materials, each having an electron-accepting property and a reduction potential greater than $-0.5$ V vs. a Saturated Calomel Electrode (SCE), and wherein the one or more organic materials provide more than 50% by volume in the intermediate connector. Preferably, the electron-accepting layer includes one or more organic materials having a reduction potential greater than $-0.1$ V vs. SCE. More preferably, the electron-accepting layer includes a single organic material having an electron-accepting property and a reduction potential greater than $-0.1$ V vs. SCE. By "electron-accepting property" it is meant that the organic material has the capability or tendency to accept at least some electronic charge from other type of material that it is adjacent.

The electron-accepting layer, including one or more organic materials having a reduction potential greater than $-0.5$ V vs. SCE and providing more than 50% by volume in the electron-accepting layer, can have both effective carrier injection and effective optical transparency in the tandem OLED. Organic materials suitable for use in the electron-accepting layer include not only simple compounds containing at least carbon and hydrogen, but also include metal complexes, e.g., transition metal complexes having organic ligands and organometallic compounds, as long as their reduction potentials are more positive than $-0.5$ V vs. SCE. Organic materials for the electron-accepting layer can include small molecules (capable of being deposited by vapor deposition), polymers, or dendrimers, or combinations thereof. Electron accepting layers are most effective when at least a portion of the electron-accepting layer does not significantly mix with adjacent layers. This is accomplished by choosing materials having molecular weight high enough to prevent such diffusion. Preferably, the molecular weight of the electron-accepting material is greater than 350. To maintain the proper electron-accepting properties of the layer, it is desirable that the one or more organic materials constitute more than 90% by volume of the electron-accepting layer. For manufacturing simplicity, a single compound is used for the electron-accepting layer.

Some examples of organic materials having a reduction potential greater than −0.5 V vs. SCE that are used to form the electron-injecting layer include, but are not limited to, derivatives of hexaazatriphenylene and tetracyanoquinodimethane. A useful thickness of the electron-accepting layer is typically between 3 and 100 nm.

The term "p-type doped organic layer" means that the organic layer has semiconducting properties after doping, and the electrical current through this layer is substantially carried by the holes. When used in the present invention, the optional p-type doped organic layer contains at least one organic host material and one p-type dopant, wherein the organic host material is capable of supporting hole transport. The hole-transporting materials used in conventional OLED devices represent a useful class of host materials for the p-type doped organic layer. Preferred materials include aromatic tertiary amines having at least one trivalent nitrogen atom that is bonded only to carbon atoms, at least one of which is a member of an aromatic ring. In one form the aromatic tertiary amine is an arylamine, such as a monoarylamine, diarylamine, triarylamine, or a polymeric arylamine. Other suitable triarylamines substituted with one or more vinyl radicals or comprising at least one active hydrogen-containing group are disclosed by Brantley et al. in U.S. Pat. Nos. 3,567,450 and 3,658,520. A more preferred class of aromatic tertiary amines are those which include at least two aromatic tertiary amine moieties as described by VanSlyke et al. in U.S. Pat. Nos. 4,720,432 and 5,061,569. Nonlimiting examples include as N,N'-di(naphthalene-1-yl)-N,N'-diphenyl-benzidine (NPB) and N,N'-diphenyl-N,N'-bis(3-methylphenyl)-1,1-biphenyl-4,4'-diamine (TPD), and N,N,N',N'-tetranaphthyl-benzidine (TNB). Another preferred class of aromatic amines are dihydrophenazine compounds as described in commonly assigned U.S. patent application Ser. No. 10/390,973 filed Mar. 18, 2003 by Kevin P. Klubek et al., entitled "Cascaded Organic Electroluminescent Devices", the disclosure of which is herein incorporated by reference. The combination of the aforementioned materials is also useful to form the p-typed doped organic layer. More preferably, the organic host material in the p-type doped organic layer includes NPB, TPD, TNB, 4,4',4"-tris(N-3-methylphenyl-N-phenyl-amino)-triphenylamine (m-MTDATA), 4,4',4"-tris(N,N-diphenyl-amino)-triphenylamine (TDATA), or dihydrophenazine compounds, or combinations thereof.

The p-type dopant in the p-type doped organic layer includes oxidizing agents with strong electron-withdrawing properties. "Strong electron-withdrawing properties" means that the organic dopant should be able to accept some electronic charge from the host to form a charge-transfer complex with the host material. Some nonlimiting examples include organic compounds such as 2,3,5,6-tetrafluoro-7,7,8,8-tetracyanoquinodimethane ($F_4$-TCNQ) and other derivatives of 7,7,8,8-tetracyanoquinodimethane (TCNQ), and inorganic oxidizing agents such as iodine, $FeCl_3$, $FeF_3$, $SbCl_5$, some other metal chlorides, and some other metal fluorides. The combination of p-type dopants is also useful to form the p-type doped organic layer. The p-type doped concentration is preferably in the range of 0.01-20 vol. %. The thickness of the p-type doped organic layer is typically less than 150 nm, and preferably in the range of about 1 to 100 nm.

The host materials used in the intermediate connectors can comprise small molecule materials or polymeric materials, or combinations thereof. In some instances, the same host material is used for both n-type and p-type doped organic layers, provided that it exhibits both hole and electron transport properties set forth above. Examples of materials that are used as host for either the n-type or p-type doped organic layers include, but are not limited to, various anthracene derivatives as described in U.S. Pat. No. 5,972,247, certain carbazole derivatives such as 4,4-bis(9-dicarbazolyl)-biphenyl (CBP), and distyrylarylene derivatives such as 4,4'-bis(2,2'-diphenyl vinyl)-1,1'-biphenyl, and as described in U.S. Pat. No. 5,121,029.

A p-type doped organic layer can form at the interface of the electron-accepting layer and the HTL simply by deposition of the HTL material. In the present invention, the materials chosen for the electron-accepting layer and the HTL are such that only a small amount of mixing occurs. That is, it is important that at least some of the electron-accepting layer does not mix with the HTL material.

When used in the present invention, the optional interfacial layer in the intermediate connector is mainly used to stop the possible inter-diffusion between materials of the various layers within the intermediate connector. The interfacial layer is a metal compound or a metal. When used, the layer should be as thin as possible to be effective, reduce optical losses, and prevent unwanted pixel cross talk if the interfacial layer is conductive or semiconductive.

The interfacial layer can contain a metal compound selected from the stoichiometric oxides or non-stoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The interfacial layer can contain a metal compound selected from the stoichiometric sulfides or non-stoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric selenides or non-stoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric tellurides or non-stoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The interfacial layer can contain a metal compound selected from the stoichiometric nitrides or non-stoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The interfacial layer 332 can contain a metal compound selected from the stoichiometric carbides or non-stoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. Particularly useful metal compounds for use in the interfacial layer are selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound is selected from $MoO_3$, $NiMoO_4$, $CuMoO_4$, or $WO_3$.

When using a metal compound, the thickness of the interfacial layer in the intermediate connector is in the range of from 0.5 nm to 20 nm.

Alternatively, the interfacial layer can include a high work function metal layer. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer includes Ag, Al, Cu, Au, Zn, In, or Sn, or combinations thereof. More preferably, the high work function metal includes Ag or Al.

When using a high work function metal, the thickness of the interfacial layer in the intermediate connector is in the range of from 0.1 nm to 5 nm.

The overall thickness of the intermediate connectors is typically from 5 nm to 200 nm. If there are more than two intermediate connectors in a tandem OLED, the intermediate connectors are the same or different from each other in terms of layer thickness, material selection, or both.

Each of the layers in the EL unit is formed from small molecule OLED materials, or polymeric LED materials, or combinations thereof. Some EL units are polymeric and other units are small molecules (or nonpolymeric), including fluorescent materials and phosphorescent materials. The corresponding layer in each of the EL units in the tandem OLED is formed using the same or different materials from those of the other corresponding layers, and can have the same or different layer thicknesses.

As mentioned previously, it is often useful to provide a hole-injecting layer (HIL) between the anode and the HTL. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, some aromatic amines, for example, m-MTDATA (4,4',4''-tris[(3-methylphenyl)phenyl-amino] triphenylamine), and inorganic oxides including vanadium oxide (VOx), molybdenum oxide (MoOx), and nickel oxide (NiOx). Alternative hole-injecting materials reportedly useful in organic EL devices are described in EP 0 891 121 A1 and EP 1 029 909 A1. p-Type doped organic materials as described previously for use in the intermediate connector are also a useful class of hole-injecting materials. Hexaazatriphenylene derivatives are also useful HIL materials, as described in U.S. Pat. No. 6,720,573. A particularly useful HIL material is shown below:

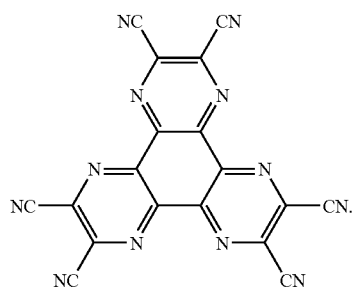

Formula M1

It is often useful to provide an electron-injecting layer (EIL) between the cathode and the ETL. n-Type doped organic layers as described previously for use in the intermediate connector are a useful class of electron-injecting materials.

The OLED of the present invention is typically provided over a supporting substrate 150 where either the cathode or anode is in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore is light transmissive, light-absorbing, or light reflective. Substrates for use include, but are not limited to, glass, plastic, semiconductor materials, silicon, ceramics, and circuit board materials. Of course, it is necessary to provide in these device configurations a light-transparent top electrode.

When EL emission is viewed through the anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material is used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes are patterned using well known photolithographic processes. Optionally, anodes are polished prior to the deposition of other layers to reduce surface roughness so as to reduce electrical shorts or enhance reflectivity.

When light emission is viewed solely through the anode, the cathode used in the present invention is comprised of nearly any conductive material. Desirable materials have effective film-forming properties to ensure effective contact with the underlying organic layer, promote electron injection at low voltage, and have effective stability. Useful cathode materials often contain a low work function metal (<4.0 eV) or metal alloy. One preferred cathode material is comprised of an MgAg alloy wherein the percentage of silver is in the range of 1 to 20% by atomic ratio, as described in U.S. Pat. No. 4,885,211. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, and EP 1 076 368. Cathode materials are typically deposited by thermal evaporation, electron beam evaporation, ion sputtering, or chemical vapor deposition. When needed, patterning is achieved through many well known methods including, but not limited to, through-mask deposition, integral shadow masking, for example as described in U.S. Pat. No. 5,276,380 and EP 0 732 868, laser ablation, and selective chemical vapor deposition.

The organic materials mentioned above are suitably deposited through a vapor-phase method such as sublimation, but are deposited from a fluid, for example, from a solvent with an optional binder to improve film formation. If the material is a polymer, solvent deposition is useful but other methods are used, such as sputtering or thermal transfer from a donor sheet. The material to be deposited by sublimation is vaporized from a sublimation "boat" often comprised of a tantalum material, e.g., as described in U.S. Pat. No. 6,237,529, or is first coated onto a donor sheet and then sublimed in closer proximity to the substrate. Layers with a mixture of materials can use separate sublimation boats or the materials are premixed and coated from a single boat or donor sheet. Patterned deposition is achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357), and inkjet method (U.S. Pat. No. 6,066,357).

Most OLED devices are sensitive to moisture or oxygen, or both, so they are commonly sealed in an inert atmosphere such as nitrogen or argon. In sealing an OLED device in an inert environment, a protective cover is attached using an organic adhesive, a metal solder, or a low melting temperature glass. Commonly, a getter or desiccant is also provided within the sealed space. Useful getters and desiccants include, alkali and alkaline metals, alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of the present invention can employ various optical enhancement schemes in order to improve its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters in functional relationship with the light-emitting areas of the display. Filters, polarizers, and anti-glare or anti-reflection coatings can also be provided over a cover or as part of a cover.

White or broadband emission is combined with color filters to provide full color or multicolor display. The color filters can include red, green, and blue filters. The present invention is suitably used in displays having four differently colored pixels, for example, red, green, blue, and white emitting pixels (RGBW) as described in U.S. Patent Application Publication 2004/0113875 A1. The white emitting pixel is substantially not filtered, although it can have some small amount of filtering to trim the color or incidental filtering that might occur due to encapsulation layers or the like provided over the white pixel. In place of white, yellow or cyan is used. Five or more color systems can also be useful.

The OLED device can have a microcavity structure. In one useful example, one of the metallic electrodes is essentially opaque and reflective; the other one is reflective and semi-transparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length is tuned by selecting the thickness of the organic layers or by placing a transparent optical spacer between the electrodes. For example, an OLED device of the present invention can have ITO spacer layer placed between a reflective anode and the organic EL media, with a semitransparent cathode over the organic EL media.

The present invention is employed in most OLED device applications. These include very simple structures comprising a single anode and cathode to more complex devices, such as area color displays, passive matrix displays comprised of orthogonal arrays of anodes and cathodes to form pixels, and active matrix displays where each pixel is controlled independently, for example, with thin film transistors (TFTs). The invention can also be employed for devices where the OLED is used as a light source, for example, in backlights for LCD displays.

The invention has been described in detail with particular reference to certain preferred embodiments thereof, but it will be understood that variations and modifications can be effected within the spirit and scope of the invention.

Parts List

10 CIE color space
12 red emitter
13 green emitter
14 blue emitter
15 desired color
16 color gamut
17 cyan emitter
18 white emitter
19 color gamut
100 tandem OLED display
105 color modifying medium
105a red color modifying medium
105b green color modifying medium
105c blue color modifying medium
110 anode
110a anode
110b anode
110c anode
110d anode
115a red-emitting pixel
115b green-emitting pixel
115c blue-emitting pixel
120.x broadband-emitting pixel
120.1 broadband light-emitting unit
120.2 broadband light-emitting unit
120.N broadband light-emitting unit
120.(N−1) broadband light-emitting unit
130.x intermediate connector
130.1 connecting layer 130. (N−1) connecting layer
150 substrate
170 cathode
300 emission spectrum
305 peak spectral component
310 blue region
315 green region
320 red region
325 peak spectral component
330 emission spectrum
340 emission spectrum
350 emission spectrum
360 emission spectrum
365 emission peak
370 emission peak
380 emission spectrum
390 emission spectrum
400 light-emitting pixel
410 hole-injecting layer
420 hole-transporting layer
425 hole-transporting layer
430 light-emitting layer
435 light-emitting layer
450 light-emitting layer
455 light-emitting layer
460 electron-transporting layer
465 electron-transporting layer
475 electron-injecting layer
510 curve
520 curve
530 curve

The invention claimed is:

1. A tandem OLED display having one or more pixels, at least one of such pixels comprises:
   a) only two spaced electrodes;
   b) two or more light-emitting units disposed between the two spaced electrodes, wherein all of such light-emitting units are broadband light-emitting units, at least two of which produce light having different emission spectra and wherein at least one of such broadband light-emitting units does not produce white light; and
   c) an intermediate connector disposed between, and serially connecting, adjacent broadband light-emitting units.

2. The tandem OLED display of claim 1 wherein one of the broadband light-emitting units produces white light and another produces cyan light comprising green and blue light.

3. The tandem OLED display of claim 1 wherein one of the broadband light-emitting units produces white light and another produces magenta light comprising red and blue light.

4. The tandem OLED display of claim 1 wherein one of the broadband light-emitting units produces white light and another produces orange light comprising red and green light.

5. The tandem OLED display of claim 1 wherein none of the broadband light-emitting units individually produce white light.

6. The tandem OLED display of claim 5 wherein the combined emissions of the broadband light-emitting units form white light.

7. The tandem OLED display of claim 1 wherein at least one of the broadband light-emitting units produces an emission spectrum with a first and a second emission peak, wherein the first emission peak has a greater intensity than the second emission peak.

8. The tandem OLED display of claim 7 wherein each of the broadband light-emitting units produces an emission spectrum with a first and a second emission peak, wherein the first emission peak has a greater intensity than the second emission peak, and wherein the first emission peaks of the broadband light-emitting units are selected so that the combined emission produces white light.

9. The tandem OLED display of claim 1 further including one or more color change modules.

10. The tandem OLED display of claim 9 further including at least three different colored gamut pixels.

11. The tandem OLED display of claim 10 further including at least one within-gamut pixel.

12. The tandem OLED display of claim 1 further including one or more color filters.

13. The tandem OLED display of claim 12 further including at least three different colored gamut pixels.

14. The tandem OLED display of claim 13 further including at least one within-gamut pixel.

15. A tandem OLED display having more than one pixel for producing different color light comprising,
   a) only two spaced electrodes for each pixel;
   b) two or more light-emitting units disposed between the two spaced electrodes for each pixel, wherein all of such light-emitting units are broadband light-emitting units, at least two of which produce light having different emission spectra and wherein at least one of such broadband light-emitting units does not produce white light;
   c) an intermediate connector disposed between, and serially connecting, adjacent broadband light-emitting units; and
   d) red, green and blue color filters individually corresponding to a different color pixel disposed to receive light from the light-emitting units displaying red, green and blue light; and
   e) a pixel without a filter for displaying broadband light.

* * * * *